US008089616B2

(12) United States Patent
Owa

(10) Patent No.: US 8,089,616 B2
(45) Date of Patent: Jan. 3, 2012

(54) PATTERN FORMING METHOD AND APPARATUS, EXPOSURE METHOD AND APPARATUS, AND DEVICE MANUFACTURING METHOD AND DEVICE

(75) Inventor: Soichi Owa, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/648,648

(22) Filed: Dec. 29, 2009

(65) Prior Publication Data

US 2010/0099049 A1 Apr. 22, 2010

Related U.S. Application Data

(63) Continuation of application No. PCT/JP2008/001881, filed on Jul. 14, 2008.

(30) Foreign Application Priority Data

Jul. 13, 2007 (JP) ................................. 2007-184137
Jul. 26, 2007 (JP) ................................. 2007-194688

(51) Int. Cl.
*G03B 27/32* (2006.01)
*G01B 11/00* (2006.01)
(52) U.S. Cl. .......................................... 355/77; 356/401
(58) Field of Classification Search .................... 355/53, 355/67, 72, 75, 77; 356/399, 401
See application file for complete search history.

(56) References Cited

U.S. PATENT DOCUMENTS

| | | | |
|---|---|---|---|
| 4,780,617 A | 10/1988 | Umatate et al. | |
| 4,798,470 A * | 1/1989 | Moriyama et al. | ............ 356/401 |
| 5,198,857 A * | 3/1993 | Goto | ............................... 355/53 |
| 5,650,840 A * | 7/1997 | Taniguchi | ........................ 355/55 |
| 7,023,610 B2 | 4/2006 | Ohtsuki et al. | |
| 2004/0130698 A1 | 7/2004 | Sato et al. | |
| 2005/0259234 A1 | 11/2005 | Hirukawa et al. | |
| 2007/0127006 A1 | 6/2007 | Shibazaki | |

FOREIGN PATENT DOCUMENTS

| | | |
|---|---|---|
| JP | A-61-44429 | 3/1986 |
| JP | 05-241008 A | 9/1993 |
| JP | A-5-241008 | 9/1993 |

(Continued)

OTHER PUBLICATIONS

Sep. 9, 2008 Search Report issued in International Patent Application No. PCT/JP2008/001881.

(Continued)

*Primary Examiner* — Edward Glick
*Assistant Examiner* — Steven H Whitesell Gordon
(74) *Attorney, Agent, or Firm* — Oliff & Berridge, PLC

(57) ABSTRACT

During a period after starting exposure to a plurality of shot areas subject to exposure on a wafer until completing the exposure, a light via a slit pair arranged on a stage that holds the wafer, of illumination light via a pattern generating device, is received, and information on a positional relation between an illumination light and the stage (and hence a positional relation between the illumination light and the wafer) is detected. With this operation, even if the information on the positional relation between the illumination light and the wafer varies due to some reason, information on the variation can be detected while performing the exposure to the plurality of shot areas. Accordingly, high-precision exposure can be achieved in an exposure operation, by considering this detection results.

28 Claims, 24 Drawing Sheets

FOREIGN PATENT DOCUMENTS

| | | |
|---|---|---|
| JP | A-9-219354 | 8/1997 |
| JP | A-2000-31015 | 1/2000 |
| JP | 2001326160 A * | 11/2001 |
| JP | A-2004-71978 | 3/2004 |
| JP | 2004-274011 A | 9/2004 |
| JP | A-2004-274011 | 9/2004 |
| JP | A-2004-327660 | 11/2004 |
| JP | A-2005-116609 | 4/2005 |
| JP | A-2007-101592 | 4/2007 |
| WO | WO 99/46835 A1 | 9/1999 |
| WO | WO 2004/053955 A1 | 6/2004 |
| WO | WO 2005/074014 A1 | 8/2005 |

OTHER PUBLICATIONS

Sep. 9, 2008 Written Opinion issued in International Patent Application No. PCT/JP2008/001881 (with translation).

* cited by examiner

PATTERN FORMING METHOD AND APPARATUS, EXPOSURE METHOD AND APPARATUS, AND DEVICE MANUFACTURING METHOD AND DEVICE

CROSS-REFERENCE TO RELATED APPLICATIONS

This application is a continuation of International Application PCT/JP2008/001881, with an international filing date of Jul. 14, 2008, the disclosure of which is hereby incorporated herein by reference in its entirety, which was not published in English.

BACKGROUND OF THE INVENTION

1. Field of the Invention

The present invention relates to pattern forming methods and apparatus, exposure methods and apparatus, and device manufacturing methods and devices, and more particularly, to a pattern forming method and a pattern forming apparatus to form a pattern in a divided area on an object using a variable shaped mask, an exposure method and an exposure apparatus to expose an object with an energy beam via the pattern forming apparatus, and a device manufacturing method using the pattern forming method or the exposure method, and a device manufactured with the device manufacturing method.

2. Description of the Background Art

Conventionally, in a lithography process for manufacturing electron devices (microdevices) such as semiconductor devices or liquid crystal display devices, a projection exposure apparatus is used that transfers a pattern formed on a mask (such as a reticle, or a photomask) onto a substrate (such as a glass plate, or a wafer), on which a sensitive agent such as a resist is coated, via a projection optical system.

In recent years, various scanning exposure apparatus of a so-called maskless type have been proposed, which use a variable shaped mask (which is also called an active mask) instead of a costly mask (a mask which is a fixed pattern master), regardless of size of a device pattern. As a kind of this maskless type scanning exposure apparatus, a scanning exposure apparatus that uses a micromirror array which is a type of a reflective spatial light modulator, as a variable shaped mask, has been proposed (e.g., see Kokai (Japanese Unexamined Patent Application Publication) No. 2004-327660). According to the scanning exposure apparatus that uses the micromirror array as a variable shaped mask, by changing a pattern generated at a variable shaped mask in synchronization with scanning of a substrate stage in a scanning direction and by exposing a substrate held on the substrate stage, a desired pattern can be formed on the substrate without difficulty, and also cost reduction and downsizing of the apparatus are possible.

However, in the scanning exposure apparatus that uses the micromirror array as the variable shaped mask, since it is relatively difficult to increase the size of the micromirror array, an illumination area (pattern formation area) on the substrate is so small (e.g. the width in a non-scanning direction (a direction orthogonal to a scanning direction in a plane parallel to the surface of the substrate) is about 0.2 mm). Therefore, in the case of using a wafer with a diameter of 300 mm as the substrate, in order to expose one wafer (assuming that the entire surface of the wafer is exposed), the wafer needs to be scanned in the scanning direction at least about 1,500 times (750 round trips), which takes a long time.

Therefore, in the case of the scanning exposure apparatus of a maskless type, there is a possibility that temperature variation of the atmosphere in the vicinity of the substrate stage or the like occurs during exposure of one substrate, and due to the temperature variation, the measurement values of a measurement device (such as a laser interferometer) used for position measurement of the substrate stage vary, which causes measurement error. In addition, there is also a risk that the exposure accuracy is lowered due to the measurement error.

Further, because the illumination area (pattern formation area) on the substrate is so small, it is difficult to expose a shot area with a size of 25 mm×33 mm on the wafer at one time. Meanwhile, in an exposure apparatus such as a liquid crystal exposure apparatus, a method is employed in which a plurality of projection optical systems are placed in a zigzag shape and a projection area (illumination area) of a mask pattern by each of the projection optical systems is set to have a trapezoidal shape using a field stop. When this method is employed for screen stitching in an exposure apparatus using a micromirror array, however, it is inefficient because some of micromirrors of the micromirror array are not used all through the exposure. Therefore, development of the pattern forming technologies, which are suitable for performing screen stitching with the variable shaped mask, has been expected.

SUMMARY OF THE INVENTION

The present invention has been made under the circumstances described above, and according to a first aspect of the present invention, there is provided a first exposure method of exposing an object with an energy beam via a pattern forming apparatus, the method comprising: a detection process in which, during a period after starting exposure to a plurality of pattern formation areas subject to exposure on the object until exposing all the pattern formation areas subject to exposure, information on a positional relation between the energy beam and the object is detected by receiving the energy beam via the pattern forming apparatus, using a measurement pattern arranged on a movable body that holds the object.

With this method, during a period from the start of exposure to a plurality of pattern formation areas subject to exposure on the object until the end of the exposure, information on the positional relation between the energy beam and the object is detected by receiving the energy beam via the pattern forming apparatus, using the measurement pattern arranged on the movable body that holds the object. With this operation, even if the information on the positional relation between the energy beam and the object varies due to some reason, the variation can be detected during the period from the start to the end of the exposure to the plurality of pattern formation areas. Accordingly, by considering the detection results, as a consequence, high-precision exposure can be achieved.

According to a second aspect of the present invention, there is provided a second exposure method of exposing an object with an energy beam via a pattern forming apparatus, the method comprising: a photodetection process in which, during a period after starting exposure to a plurality of pattern formation areas subject to exposure on the object until exposing all the pattern formation areas subject to exposure, the energy beam via the pattern forming apparatus is received using a measurement pattern arranged on a movable body that holds the object.

With this method, during a period from the start of exposure to a plurality of pattern formation areas subject to exposure on the object until the end of the exposure, the energy beam via the pattern forming apparatus is received using the measurement pattern arranged on the movable body that holds the object. Accordingly, the photodetection results of the energy beam obtained by receiving the energy beam during the period from the start to the end of the exposure to the plurality of pattern formation areas can be reflected in the exposure operation, and as a consequence, high-precision exposure can be achieved.

According to a third aspect of the present invention, there is provided an exposure apparatus to expose an object with an energy beam via a pattern forming apparatus, the exposure apparatus comprising: a movable body that moves while holding the object, wherein a measurement pattern is arranged in a section of the movable body excluding a holding section that holds the object, the section being a section through which the energy beam passes during a period after starting exposure to a plurality of pattern formation areas subject to exposure on the object until exposing all the pattern formation areas subject to exposure.

With this apparatus, during a period from the start of exposure to a plurality of pattern formation areas subject to exposure on the object until the end of the exposure, the energy beam via the measurement pattern can be received. Accordingly, the results of receiving the energy beam via the measurement pattern during the period from the start to the end of the exposure to the plurality of pattern formation areas can be reflected in the exposure operation, which consequently makes it possible to achieve high-precision exposure.

According to a fourth aspect of the present invention, there is provided a first pattern forming method of forming a pattern in at least one divided area on an object by using a variable shaped mask which has a plurality of modulation elements that are two-dimensionally placed at an irradiation position of an illumination light and that spatially and individually modulate at least one of amplitude, phase and polarization states of the illumination light, and which generates light patterns made up of bright areas and dark areas, the method comprising: a control process in which, when a target pattern is formed in the divided area on the object by stitching the light patterns generated by the variable shaped mask, the plurality of modulation elements of the variable shaped mask are controlled based on information on the target pattern and information on setting of a template that defines a use area of the variable shaped mask.

With this method, by determining information on the setting of the template so that the target pattern is formed by stitching the generated light patterns, taking into consideration the information on the target pattern and the information on arrangement of a plurality of modulation elements of the variable shaped mask, the plurality of modulation elements of the variable shaped mask are controlled based on the information on the target pattern and the determined information on setting of the template. Consequently, the target pattern is formed in the divided area on the object by stitching of the light patterns generated by the variable shaped mask.

According to a fifth aspect of the present invention, there is provided a second pattern forming method of forming a pattern in at least one divided area on an object by using a variable shaped mask which has a plurality of modulation elements that are two-dimensionally placed at an irradiation position of an illumination light and that spatially and individually modulate at least one of amplitude, phase and polarization states of the illumination light, and which generates light patterns made up of bright areas and dark areas, the method comprising: when a target pattern is formed in the divided area on the object by stitching the light patterns generated by the variable shaped mask, a setting process in which a plurality of templates that define a use area of the variable shaped mask are respectively set in a two-dimensional pixel area where the target pattern is formed, in a state where an overlap area between the templates is partly generated; and a control process in which the plurality of modulation elements of the variable shaped mask are sequentially controlled based on information on setting of the respective templates and information on the target pattern.

With this method, when the target pattern is formed in the divided area on the object by stitching the light patterns generated by the variable shaped mask, a plurality of templates that define the use area of the variable shaped mask are respectively set in the two-dimensional pixel area where the target pattern is formed, in a state where the overlap areas are partly generated. Then, based on the information on setting of the respective templates and the information on the target pattern, a plurality of modulation elements of the variable shaped mask are sequentially controlled. Accordingly, the overlap areas are generated in a part of the stitching sections of the light patterns and the level difference is prevented from occurring in the stitching lines, which makes it possible to form the target pattern with high precision in the divided area on the object.

According to a sixth aspect of the present invention, there is provided a third pattern forming method of forming a pattern in at least one divided area on an object by using a pattern generator which has a plurality of modulation elements that spatially and individually modulate at least one of amplitude, phase and polarization states of an illumination light, and which generates light patterns, and by illuminating the object with the illumination light in accordance with the light patterns, the method comprising: a control process in which, when a target pattern is formed in the divided area by sequentially illuminating a partial section of the divided area on the object with the illumination light in accordance with the light patterns generated by the pattern generator, the plurality of modulation elements of the pattern generator are controlled based on information on the target pattern and information that defines a use area of the pattern generator.

With this method, by determining information that defines the use area of the pattern generator so that the target pattern is formed in a divided area on the object by sequentially illuminating the partial section of the divided area with the illumination light in accordance with the generated light patterns, taking into consideration the information on the target pattern and the information on arrangement of a plurality of modulation elements of the pattern generator, the plurality of modulation elements of the pattern generator are controlled based on the information on the target pattern and the determined information that defines the use area of the pattern generator, and as a consequence, the target pattern is formed in the divided area on the object by the stitching of the light patterns generated by the pattern generator.

According to a seventh aspect of the present invention, there is provided a first pattern forming apparatus to form a pattern on an object, the apparatus comprising: an illumination system that emits an illumination light; a variable shaped mask which has a plurality of modulation elements that are two-dimensionally placed at an irradiation position of the illumination light and that spatially and individually modulate at least one of amplitude, phase and polarization states of the illumination light, and which generates light patterns made up of bright areas and dark areas; and a controller that, when a target pattern is formed in a divided area on the object by stitching the light patterns generated by the variable shaped mask, controls the plurality of modulation elements of the variable shaped mask based on information on the target pattern and information on setting of a template that defines a use area of the variable shaped mask.

With this apparatus, by determining information on setting of the template so that the target pattern is formed by the stitching of the generated light patterns, taking into consideration the information on the target pattern and the information on arrangement of a plurality of modulation elements of the variable shaped mask, the controller controls the plurality of modulation elements of the variable shaped mask based on the information on the target pattern and the determined information on setting of the template, and as a consequence, the target pattern is formed in the divided area on the object by the stitching of the light patterns generated by the variable shaped mask.

According to an eighth aspect of the present invention, there is provided a second pattern forming apparatus to form a pattern on an object, the apparatus comprising: an illumination system that emits an illumination light; a variable shaped mask which has a plurality of modulation elements that are two-dimensionally placed at an irradiation position of the illumination light and that spatially and individually modulate at least one of amplitude, phase and polarization states of the illumination light, and which generates light patterns made up of bright areas and dark areas; a template setting device that, when a target pattern is formed in a divided area on the object by stitching the light patterns generated by the variable shaped mask, sets a plurality of templates that define a use area of the variable shaped mask, respectively, in a two-dimensional pixel area where the target pattern is formed, in a state where an overlap area between the templates is partly generated; and a controller that sequentially controls the plurality of modulation elements of the variable shaped mask based on information on setting of the respective templates and information on the target pattern.

With this apparatus, when the target pattern is formed in the divided area on the object by stitching the light patterns generated by the variable shaped mask, the template setting device sets a plurality of templates that define the use area of the variable shaped mask respectively, in the two-dimensional pixel area where the target pattern is formed, in a state where the overlap areas are partly generated. Then, the controller sequentially controls a plurality of modulation elements of the variable shaped mask based on the information on setting of the respective templates and the information on the target pattern. Accordingly, the overlap areas are generated in a part of the stitching sections of the light patterns, and the level difference is prevented from occurring in the stitching lines, which makes it possible to form the target pattern in the divided area on the object with high precision.

According to a ninth aspect of the present invention, there is provided a third pattern forming apparatus to form a pattern on an object, the apparatus comprising: a pattern generator which has a plurality of modulation elements that spatially and individually modulate at least one of amplitude, phase and polarization states of an illumination light, and which generates light patterns; and a controller that, when a target pattern is formed in a divided area on the object by sequentially illuminating a partial section of the divided area with the illumination light in accordance with the light patterns generated by the pattern generator, controls the plurality of modulation elements of the pattern generator based on information on the target pattern and use-area-setting information that defines a use area of the pattern generator.

With this apparatus, by determining information that defines the use area of the pattern generator so that the target pattern is formed in a divided area on the object by sequentially illuminating the partial section of the divided area with the illumination light in accordance with the generated light patterns, taking into consideration the information on the target pattern and the information on arrangement of a plurality of modulation elements of the pattern generator, the controller controls the plurality of modulation elements of the pattern generator based on the information on the target pattern and the determined information that defines the use area of the pattern generator, and as a consequence, the target pattern is formed in the divided area on the object by the stitching of the light patterns generated by the pattern generator.

Further, in a lithograph process, the productivity of microdevices with high integration can be improved by transferring device patterns on substrates using the first or second exposure method of the present invention.

Further, in a lithograph process, the productivity of microdevices with high integration can be improved by forming a pattern on an object and processing the object on which the pattern has been formed using any one of the first to third exposure methods of the present invention.

Accordingly, from another aspect, it can be said that the present invention is a device manufacturing method using one of the first and second exposure methods of the present invention or any one of the first to third pattern forming methods of the present invention, and a device that is manufactured with the device manufacturing method.

BRIEF DESCRIPTION OF THE DRAWINGS

In the accompanying drawings;

FIG. 17A is a view showing template TP1 set in a variable shaped mask, FIG. 17B is a view showing an example of pattern data (mask data), and FIG. 17C is a view showing output data that is output from the main controller to a drive system when template TP1 is set in the pattern date shown in FIG. 17B;

DESCRIPTION OF THE EMBODIMENTS

First Embodiment

Figure 1:
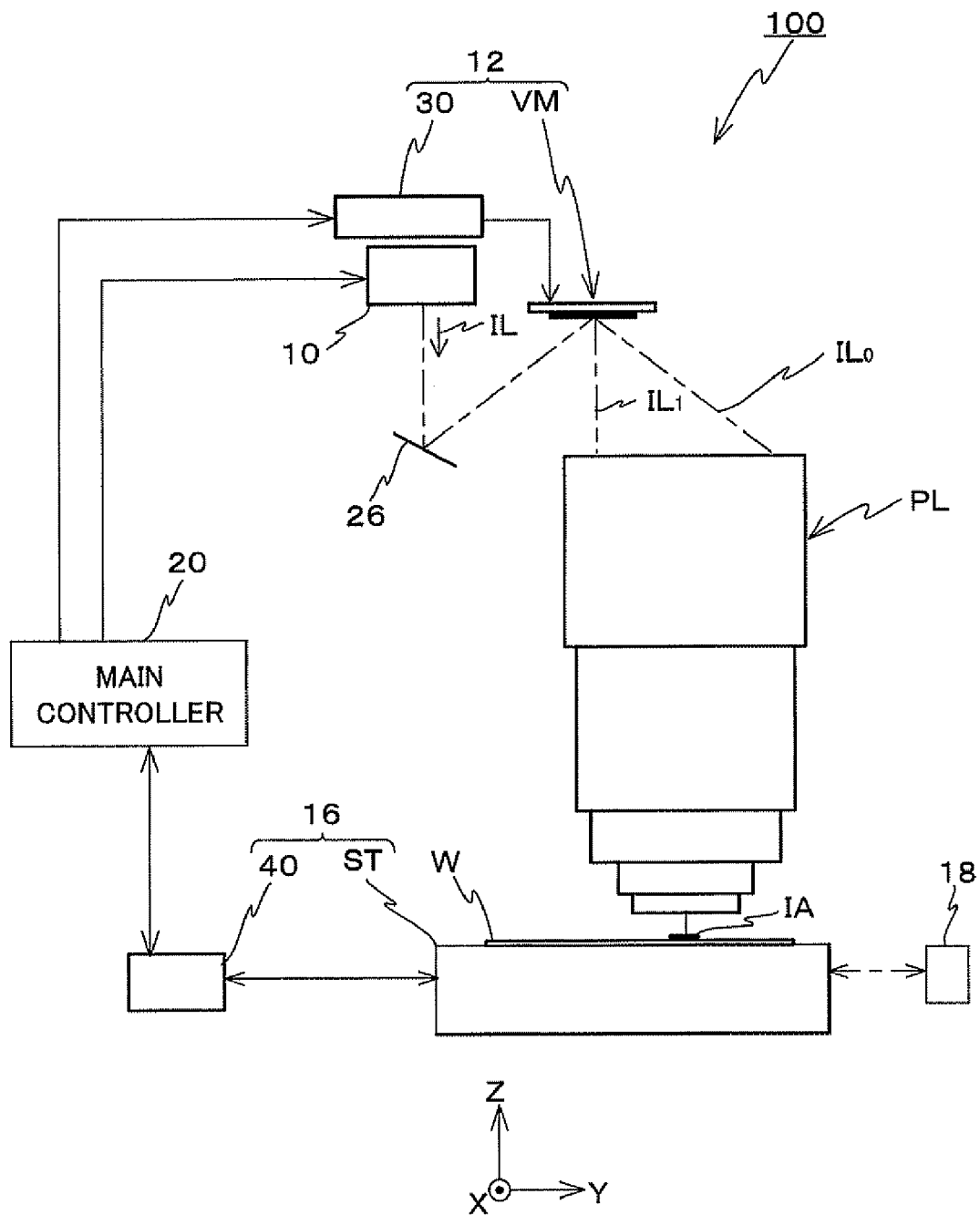
FIG. 1 is a schematic view showing an exposure apparatus related to a first embodiment.

A first embodiment of the present invention is described below, referring to FIGS. 1 to 7. FIG. 1 schematically shows a configuration of an exposure apparatus 100 related to the first embodiment.

Exposure apparatus 100 is equipped with an illumination system 10, a pattern generating device 12, a projection optical system PL, a stage device 16, a control system, and the like. Exposure apparatus 100 forms an image of a pattern (a pattern image), generated by pattern generating device 12, on a wafer W mounted on a stage ST that constitutes a part of stage device 16, using projection optical system PL. The control system includes a microcomputer and is mainly configured of a main controller 20 that performs overall control of the entire apparatus. And, exposure apparatus 100 is a scanning type exposure apparatus that forms a pattern on wafer W by synchronizing change (switching) of generated patterns by a variable shaped mask VM and movement of wafer W.

Illumination system 10 includes a light source system including a light source unit and a light source control system, an illumination optical system (none of which are shown), a reflection mirror 26, and the like. The illumination optical system includes a shaping optical system that makes illumination conditions variable, an optical integrator (an illuminance uniformizing member), a field stop, a relay lens, and the like (none of which are shown), and in the description below, the explanation is given assuming that the illumination optical system also includes reflection mirror 26. Note that, as the optical integrator, for example, a fly-eye lens, an internal reflection type integrator, a diffraction optical element, or the like is used.

As the light source unit, as is disclosed in, for example, International Publication No. 1999/46835 (the corresponding U.S. Pat. No. 7,023,610), a harmonic generating device is used that includes a solid-state laser light source such as a DFB semiconductor laser or a fiber laser, a light amplifying section having a fiber amplifier and the like, a wavelength converting section, and the like, and that outputs a pulsed light having a wavelength of 440 to 445 nm.

Pattern generating device 12 is an electron mask system that generates a variable pattern to be projected on wafer W mounted on stage ST, and is equipped with variable shaped mask VM, a drive system 30 that controls an operation state of a plurality of micromirrors that constitute variable shaped mask VM, and the like In this case, variable shaped mask VM includes, for example, a micromirror array that is a type of a non-emitting type image display device (which is also called a spatial light modulator (SLM)).

Figure 2:
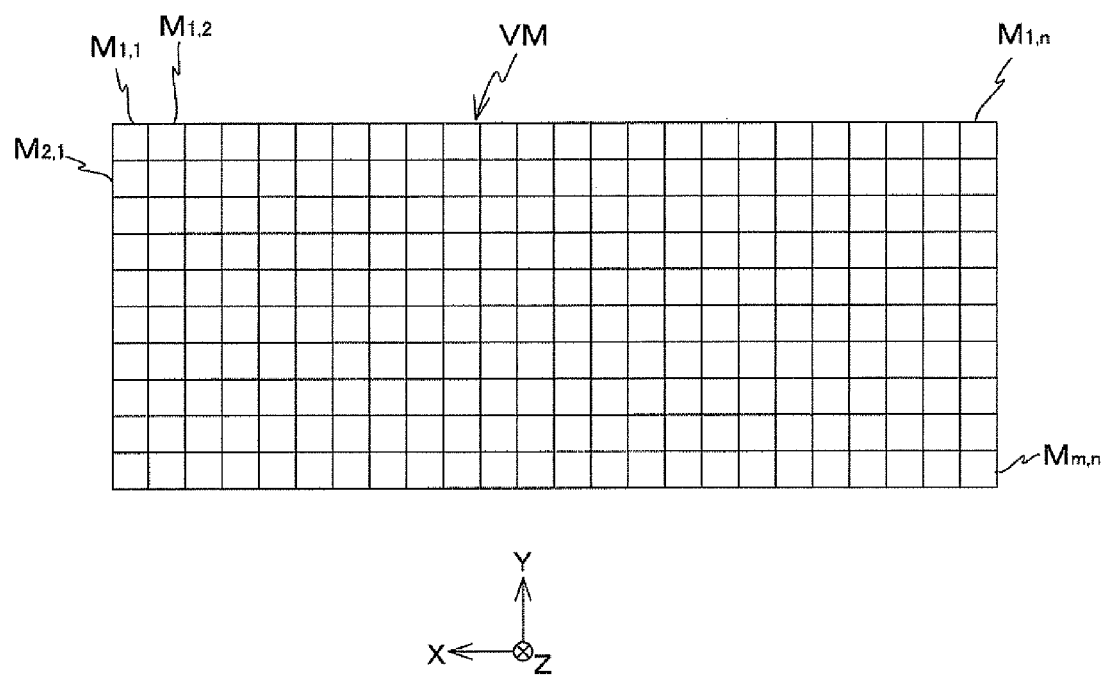
FIG. 2 is a view showing an arrangement of micromirror mechanisms in a variable shaped mask shown in FIG. 1.

As variable shaped mask VM, as an example, a micromirror array serving as an optical device is used, which includes a plurality of micromirror mechanisms $M_{ij}$ (i=1 to m, j=1 to n) in m rows and n columns that are placed two-dimensionally (in an array shape) in an XY plane, as shown in FIG. 2. In the embodiment, it is assumed that m=10 and n>m stand, as an example.

The micromirror array is made up of movable micromirror mechanisms formed with a MEMS technology on an integrated circuit made in a CMOS process, and each micromirror mechanism $M_{ij}$ has a micromirror and a drive mechanism, and the drive mechanism can make the micromirror perform reciprocating rotation around a predetermined axis, which is, in this case, around an axis parallel to the X-axis between a first position (a position where a reflection surface of the micromirror is parallel to the XY plane) and a second position (a position where the reflection surface is rotated at a predetermined angle α from the first position in an anticlockwise direction in FIG. 1). Variable shaped mask VM spatially modulates the intensity (amplitude) of an incident light on projection optical system PL by reflecting (deflecting) an illumination light IL that is incident into a direction toward projection optical system PL or a direction outside projection optical system PL by a unit of a micromirror (mirror element) disposed (placed) two dimensionally.

Drive system 30 is connected to main controller 20. Main controller 20 acquires information on a target pattern, e.g. design data (e.g. CAD data) of the target pattern, from a high-level device (not shown), and computes control information for drive system 30 in accordance with a pattern to be generated by variable shaped mask VM (hereinafter, referred to as a mask pattern, for the sake of convenience), using the design data.

The mask pattern is to be scrolled during scanning exposure and is shown as display data displayed by temporal frame-by-frame advance. The scroll speed (display speed) of the mask pattern in this case is determined by main controller 20, as a part of scanning exposure parameters that include the movement speed of stage ST (to be described later) and the like.

Drive system 30 supplies a drive signal to variable shaped mask VM according to the control information supplied from main controller 20. Accordingly, a binary operation of the respective micromirrors is performed between an ON state and an OFF state, and the micromirrors generate a desired reflection pattern as the entire variable shaped mask VM. More specifically, the binary operation of the respective micromirrors is performed between the ON state where a $0^{th}$-order diffraction light (a $0^{th}$-order light, a specular reflection light) $IL_0$ and a $1^{st}$-order diffraction light $IL_1$ are guided into a direction entering projection optical system PL and the OFF state where the $0^{th}$-order light $IL_0$ (and the $1^{st}$-order diffraction light $IL_1$) of illumination light IL are guided into a non-exposure optical path outside projection optical system PL, and the micromirrors generate a desired pattern (a reflection pattern) as a whole. And, an image of this pattern (a pattern image) is formed on wafer W via projection optical system PL. The image-forming of the pattern image on wafer W in this embodiment is performed by making use of interference among a plurality of diffraction lights having different orders, or more specifically, as can be seen from FIG. 1, dual-beam interference between the $0^{th}$-order diffraction light $IL_0$ and the $1^{st}$-order diffraction light $IL_1$, from the pattern generated at variable shaped mask VM, of illumination light IL that has been irradiated on variable shaped mask VM. Therefore, in the OFF state, at least the $0^{th}$-order diffraction light $IL_0$, of the $1^{st}$-order diffraction light $IL_1$ and the $0^{th}$-order diffraction light $IL_0$, does not enter projection optical system PL.

Projection optical system PL has a plurality of optical elements placed in a predetermined positional relation inside a barrel. Projection optical system PL reduces and projects the pattern, generated by pattern generating device 12, on wafer W placed on the plane to be exposed, with projection magnification β (β is, for example, ½₀₀, ¼₀₀ or ⅕₀₀ fold, or the like). Therefore, when variable shaped mask VM is illuminated with illumination light IL from illumination system 10, illumination light IL reflected off variable shaped mask VM forms a reduced image (a partial inverted image) of a circuit pattern, generated by variable shaped mask VM via projection optical system PL, on an exposure area IA on wafer W whose surface is coated with a photoresist. Note that, in the embodiment, the width (the length) of exposure area IA in the X-axis direction is set, e.g., to around 0.2 mm.

Stage device 16 is equipped with stage ST that is movable holding wafer W subject to exposure and a stage drive system 40 that controls an operating state (such as movement) of stage ST according to commands from main controller 20.

Figure 3:
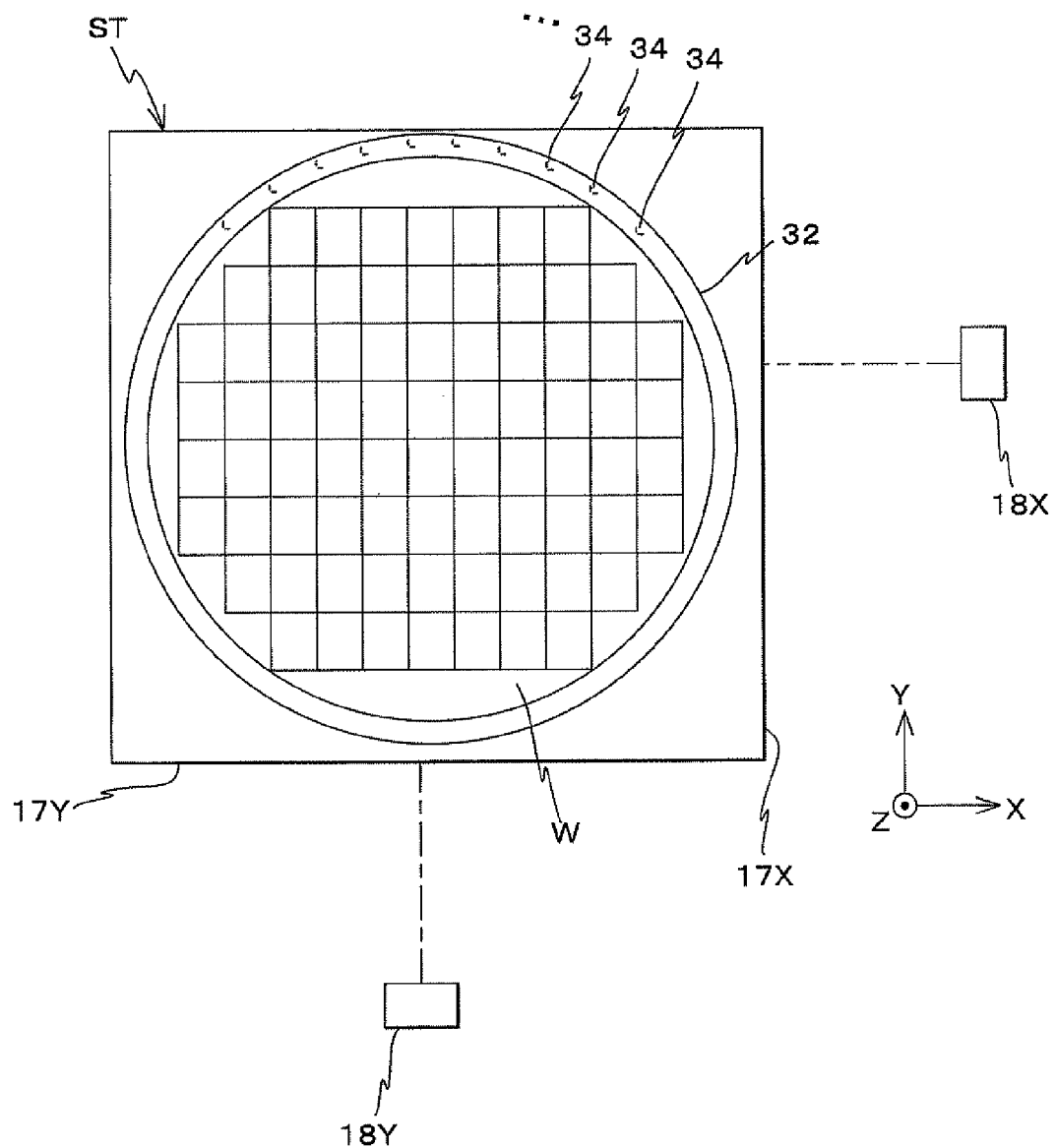
FIG. 3 is a plan view showing a stage and interferometers.

As shown in a plan view in FIG. 3, stage ST holds wafer W via a wafer holder (not shown) arranged in the center of the upper surface (the +Z side surface) of stage ST. Further, on the upper surface (the side surface) of stage ST, a slit plate 32 having an annular shape is arranged so as enclose wafer W.

In the vicinity of the +Y side end of slit plate 32, a plurality of (10 in this case) slit pairs 34 with a predetermined spacing in the X-axis direction (in this case, with the spacing that is the same as the width of a shot area in the X-axis direction on wafer W). As enlargedly shown in FIG. 4A, each slit pair 34 includes an opening pattern having a slit shape (hereinafter, referred to as a "slit") 34x with the Y-axis direction serving as its longitudinal direction and a width 2D in the X-axis direction, and a slit 34y with the X-axis direction serving as its longitudinal direction and a width 2D in the Y-axis direction. Note that, in actuality, as shown in FIG. 4B, slit plate 32 is composed of a glass plate 32a (actually having an annular shape in a planar view) and a reflection film 32b also serving as a light-shielding film that is formed on the upper surface of glass plate 32a, and slits 34x and 34y are formed on a part of reflection film 32b by patterning.

Figure 4A:
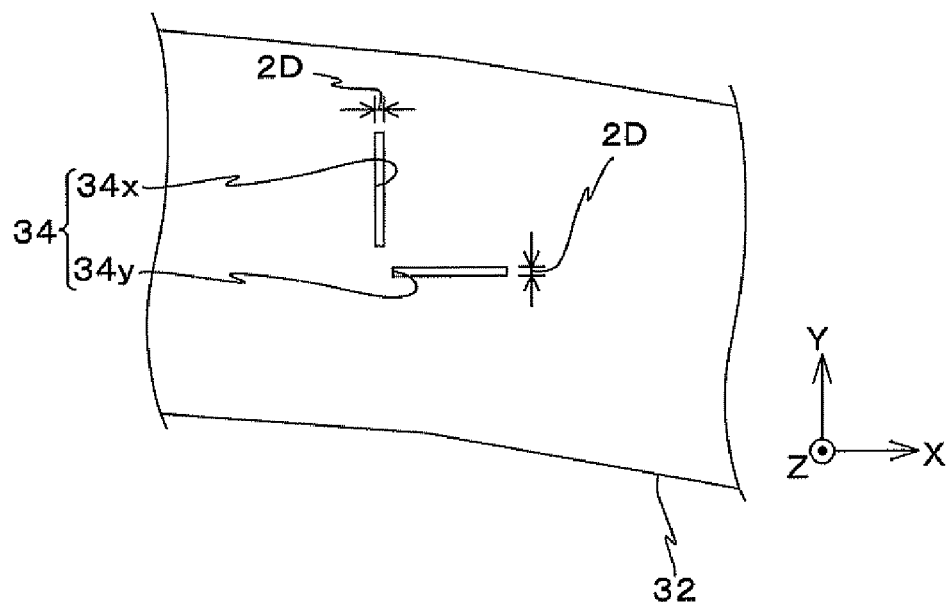
FIG. 4A is a plan view showing a slit pair.
Figure 4B:
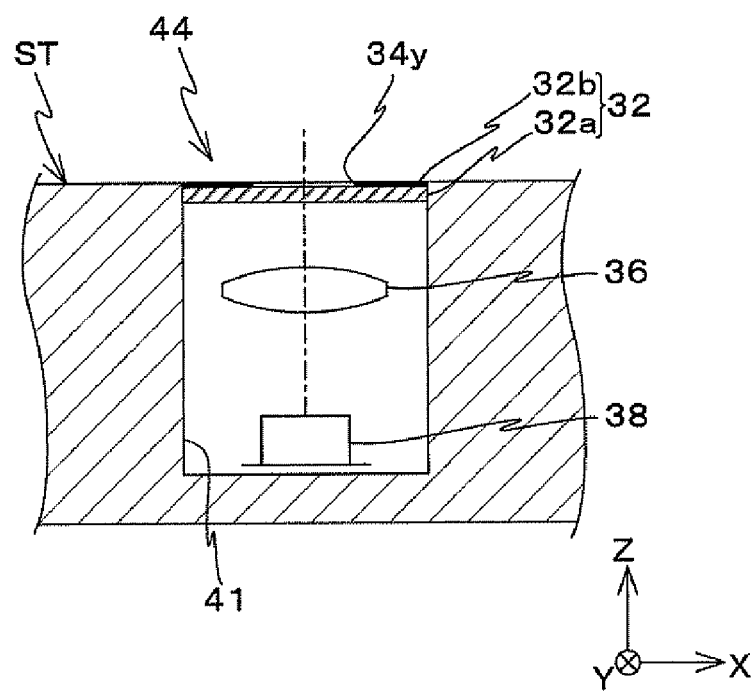
FIG. 4B is a longitudinal sectional view of an aerial image measuring instrument.

As shown in FIG. 4B, slit plate 32 is arranged at stage ST in a state of covering a depression 41 formed in a dug-in state from the upper surface of stage ST (depression 41 is actually has an annular shape in a planar view (when viewed from above) similar to split plate 32). Further, although omitted in the drawings, the upper surface (the +Z side surface) of slit plate 32 and the upper surface (the +Z side surface) of wafer W held on stage ST are substantially coplanar.

Below (on the Z-side of) slits 34y and 34x within depression 41, a condenser lens 36 and a photodetector 38 composed of a photoelectric conversion element are arranged, as respectively shown in FIG. 4B. To each of photodetectors 38, a signal processing system (not shown) to which a photoelectric conversion signal of the photodetector is supplied is connected. In this embodiment, an aerial image measuring instrument 44 is configured including each slit of slit pair 34, condenser lens 36 and photodetector 38. This means that, in the configuration shown in FIG. 3, 20 of aerial image measuring instruments 44 are arranged on stage ST. Incidentally, in a case where a configuration is employed in which a two-dimensional sensor is used as photodetector 38 and condenser lens 36 guides both a light having passed through slit 34x of one slit pair 34 and a light having passes through slit 34y the one slit pair 34 to a detection surface of the two-dimensional sensor, one each of condenser lens 36 and photodetector 38 can be arranged for one slit pair 34.

As photodetector 38, a photoelectric conversion element (a light-receiving element) that can detect a fine light with high precision, for example, a photomultiplier tube (PMT) or a photodiode is used. The signal processing system that processes the output signal of photodetector 38 includes an amplifier, an A/D converter (in general, the converter with a 16-bit resolution is used) or the like.

Referring back to FIG. 1, stage ST is movable in the X-axis, Y-axis, and Z-axis directions and also rotatable around the Z-axis (a θz direction) by stage drive system 40, and can align wafer W in the directions of four degrees of freedom with respect to the pattern image of variable shaped mask VM that is generated via projection optical system PL. Incidentally, it is also possible that stage ST is configured rotatable also in rotational (θx, θy) directions around the X-axis and the Y-axis and capable of aligning wafer W in the directions of six degrees of freedom with respect to the pattern image.

Positional information (including rotational information) of stage ST is constantly detected with a resolution of, for example, around 0.5 to 1 nm by a wafer laser interferometer (hereinafter, referred to as a "laser interferometer") 18 that irradiates measurement beams on reflection surfaces formed by mirror-polishing the end surfaces (the side surfaces) of stage ST.

To be more specific, as shown in FIG. 3, in actuality, the +X side surface of stage ST serves as a reflection surface 17x and the −Y side surface serves as a reflection surface 17Y, and corresponding to the reflection surfaces, a laser interferometer 18x for X-axis direction position measurement and a laser interferometer 18Y for Y-axis direction position measurement are arranged respectively. At least one of laser interferometer 18x for X-axis direction position measurement and laser interferometer 18Y for Y-axis direction position measurement is a multiaxial interferometer having a plurality of measurement axes, and can measure rotation (at least including the rotation in the θz direction (yawing)) of stage ST in addition to the X-position and the Y-position of stage ST.

Incidentally, it is also possible that the multiaxial interferometers are used as both laser interferometers 18x and 18Y so that not only the yawing but also the pitching (rotation in the θx direction) and the rolling (rotation in the θy direction) can be measured. Further, a position measurement system that measures positional information (including rotational information) of stage ST can be configured including an encoder arranged instead of or in addition to the interferometers and furthermore, where necessary, including a focus sensor or the like.

Referring back to FIG. 1, main controller 20 controls the operations of illumination system 10, pattern generating device 12, stage device 16 and the like, to form an image of a pattern, sequentially generated at variable shaped mask VM, on wafer W via projection optical system PL. During this operation, main controller 20 performs scanning type exposure by, while moving wafer W at an appropriate speed, scrolling the pattern generated at variable shaped mask VM synchronously with the movement of wafer W, via drive system 30.

In this case, assuming that a scanning speed of stage ST that holds wafer W is denoted by V1, a display speed V2 in the scanning direction of the pattern displayed at variable shaped mask VM is denoted by V1/β (V2=V1/β). Accordingly, if projection magnification β of projection optical system PL is ½₀₀, then the display speed V2 in the scanning direction of the pattern of variable shaped mask VM is 200-fold the speed V1 of stage ST.

Note that an alignment detection system is placed on the side surface of projection optical system PL, although not shown in the drawings. In this embodiment, an image-forming type alignment sensor that detects street lines or position detection marks (fine alignment marks) formed on wafer W is used as the alignment detection system. The detailed configuration of the alignment detection system is disclosed in, for example, Kokai (Japanese Unexamined Patent Application Publication) No. 09-219354. Detection results obtained by the alignment detection system are supplied to main controller 20.

Figure 5:
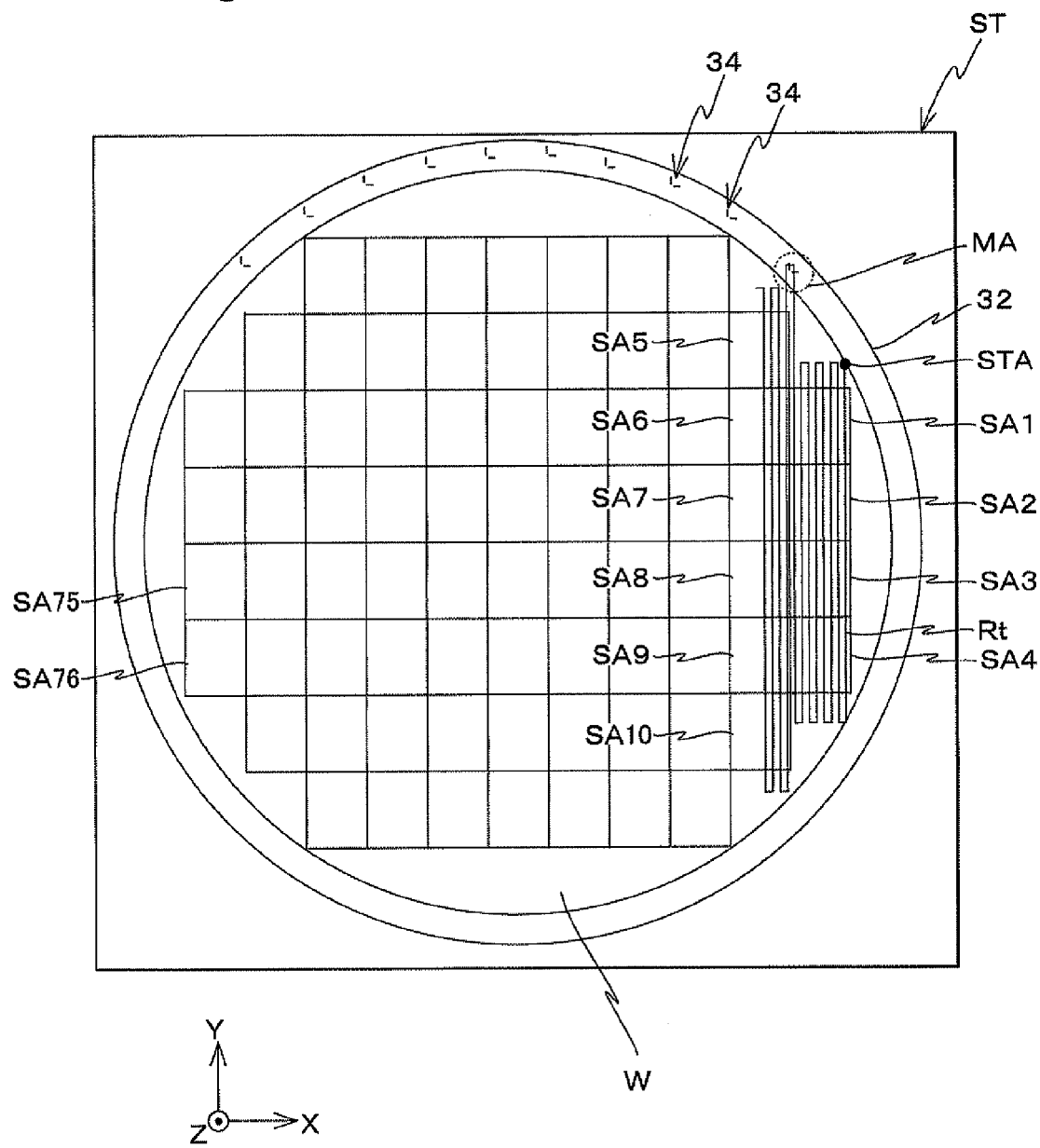
FIG. 5 is a view showing a course in which an exposure area IA moves on a wafer.

In exposure apparatus 100 related to the present embodiment having the configuration as described above, a series of operations including an exposure operation is executed in the manner described below. Note that, in the present embodiment, it is assumed that a wafer with a diameter of 300 mm is used as wafer W, 76 shot areas SA1 to SA76 subject to pattern formation are present on wafer W, and each shot area has a rectangular shape with a width of 26 mm in the X-axis direction and a width of 33 mm in the Y-axis direction, as shown in FIG. 5. And, the shot areas disposed along the Y-axis are to be referred to "a shot area column" as a whole, and the respective shot area columns, starting from the +X direction, are to be referred to as "a first shot area column", "a second shot area column", . . . , "an eleventh shot area column".

First of all, main controller 20 performs preparatory processing such as baseline measurement of an alignment system (not shown) using a reference mark member or the like, in a state where wafer W is loaded on stage ST.

Subsequently, main controller 20 performs the EGA (Enhanced Global Alignment), which is disclosed in, for example, Kokai (Japanese Unexamined Patent Application Publication) No. 61-044429 (the corresponding U.S. Pat. No. 4,780,617) and the like, using the alignment system (not shown).

Then, after the EGA described above has been completed, main controller 20 moves stage ST via stage drive system 40 based on positional information of stage ST measured by laser interferometers 18x and 18Y, and sets the position of wafer W at an exposure start position. Note that the exposure start position in this case is assumed to be a position with which exposure area IA is set at a position indicated by a reference sign STA in FIG. 5.

After that, main controller 20 makes illumination system 10, pattern generating device 12, stage device 16 and the like operate at appropriate timing, and projects an image of a pattern, generated by pattern generating device 12, at appropriate positions on wafer W via projection optical system PL. In this case, in the present embodiment, as indicated by a course Rt in FIG. 5, while moving wafer W (stage ST) in the +Y direction so that the exposure area (the pattern image) moves in the −Y direction on wafer W, the image of the pattern generated by pattern generating device 12 is projected via projection optical system PL, and the +X side end (a portion with a width of 0.2 mm in the X-axis direction) of the first shot area column (the column including shot areas SA1, SA2, SA3 and SA4) located on the farthest +X-side on wafer W is exposed. More specifically, the exposure operation with a scanning method is executed to the vicinity of the +X side end of the first shot area column.

Then, when the first-time exposure with the scanning method described above has been completed, a stepping operation of stage ST is performed in the X-axis direction (the +X direction), by the width (0.2 mm) of exposure area IA in the X-axis direction, and while moving stage ST in a direction (the −Y direction) opposite to the previous direction, the first shot area column is exposed with the scanning method. Furthermore, after that, along course Rt shown in FIG. 5, while the stepping operation in the +X direction and the scanning operation in the Y-axis direction are repeated, pattern formation on the first shot area column (SA1 to SA4) is performed.

Note that, in this embodiment, the width in the X-axis direction of shot areas SA1 to SA4 is 26 mm and the width in the X-axis direction of exposure area IA is 0.2 mm, and therefore, the foregoing scanning operation in the Y-axis direction needs to be repeated 130 times actually, in order to expose the entire surface of the first shot area column (SA1 to SA4) (however, course Rt is illustrated in a simplified manner in FIG. 5 for the sake of convenience).

Afterwards, main controller 20 also performs the exposure operation of the second shot area column including shot areas SA5 to SA10 in the similar manner to the exposure operation of the first shot area column, and similarly performs the exposure operation to the third to eleventh shot area columns.

Meanwhile, main controller 20 in the present embodiment executes an aerial image measuring operation, using aerial image measuring instruments 44 arranged on stage ST, between the exposures of the respective shot area columns (i.e. a period after exposure of the $k^{th}$ (k=1 to 10) shot area column has been completed until exposure of the $(K+1)^{th}$ shot area column begins).

Figure 6A:
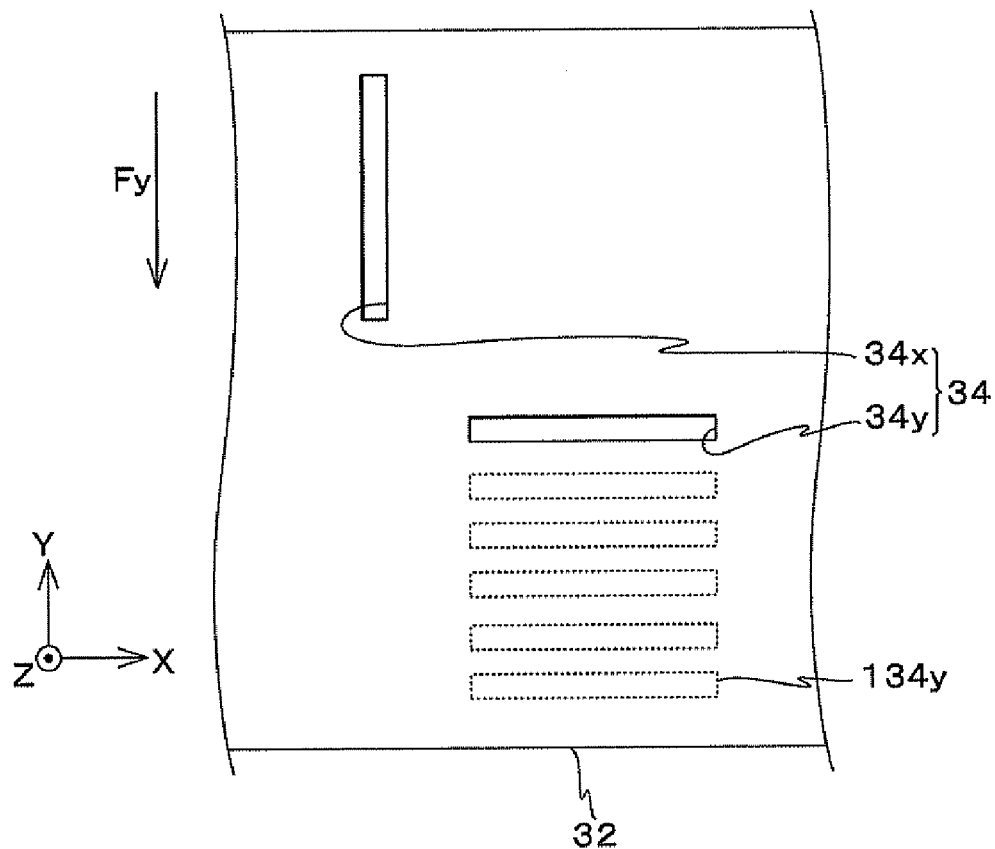
FIG. 6A is a view used to explain a measurement method of an aerial image $134y$.

More specifically, for example, when exposure area IA is present in an area MA on stage ST shown in FIG. 5, main controller 20 drives variable shaped mask VM via drive system 30 and forms an aerial image 134y of a line-and-space pattern having a periodic direction in the Y-axis direction, as shown in FIG. 6A, on slit plate 32. In this case, since the line-and-space pattern is formed in an area that is set in advance on variable shaped mask VM, the positional relation between aerial image 134y and projection optical system PL is assumed to be constant at all times.

From this state, main controller 20 moves stage ST in the −Y direction (an arrow Fy direction) via stage drive system 40 so that aerial image 134y and slit 34y relatively move in the Y-axis direction.

During this movement, a light (illumination light) having passed through slit 34y is received by photodetector 38 via condenser lens 36 in stage ST, and a photoelectric conversion signal of the light is supplied to main controller 20 via the signal processing system (not shown). Main controller 20 measures the light intensity distribution corresponding to aerial image 134y based on the photoelectric conversion signal.

Figure 6B:
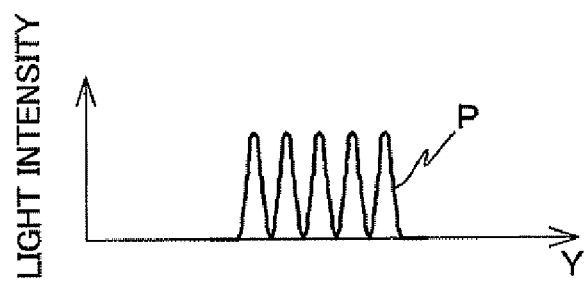
FIG. 6B is a view showing an example of a photoelectric conversion signal (light intensity signal) P obtained during aerial image measurement.

FIG. 6B shows an example of a photoelectric conversion signal (light intensity signal) P obtained during the aerial image measurement described above.

In this case, aerial image 134y is averaged due to influence of the width (2D) of slit 34y in the scanning direction (the Y-axis direction).

Accordingly, if the slit is denoted by p(y), the intensity distribution of the aerial image is denoted by i (y), the observed light intensity signal is denoted by m(y), then the relation between the intensity distribution i(y) of the aerial image and the observed light intensity signal m(y) can be expressed in the following formula (I). In this formula (1), a unit of intensity distribution i(y) and the intensity signal m(y) is assumed to be the intensity per a unit length.

$$m(y) = \int_{-\infty}^{\infty} p(y-u) \cdot i(u) du \quad (1)$$

$$p(y) = \begin{cases} 1 (y \le D) \\ 0 (y > D) \end{cases} \quad (2)$$

That is, the observed light intensity signal m(y) is the convolution of the slit p(y) and the intensity distribution i(y) of the aerial image. Accordingly, from the aspect of measurement accuracy, the smaller slit width 2D is, the better.

Figure 7:
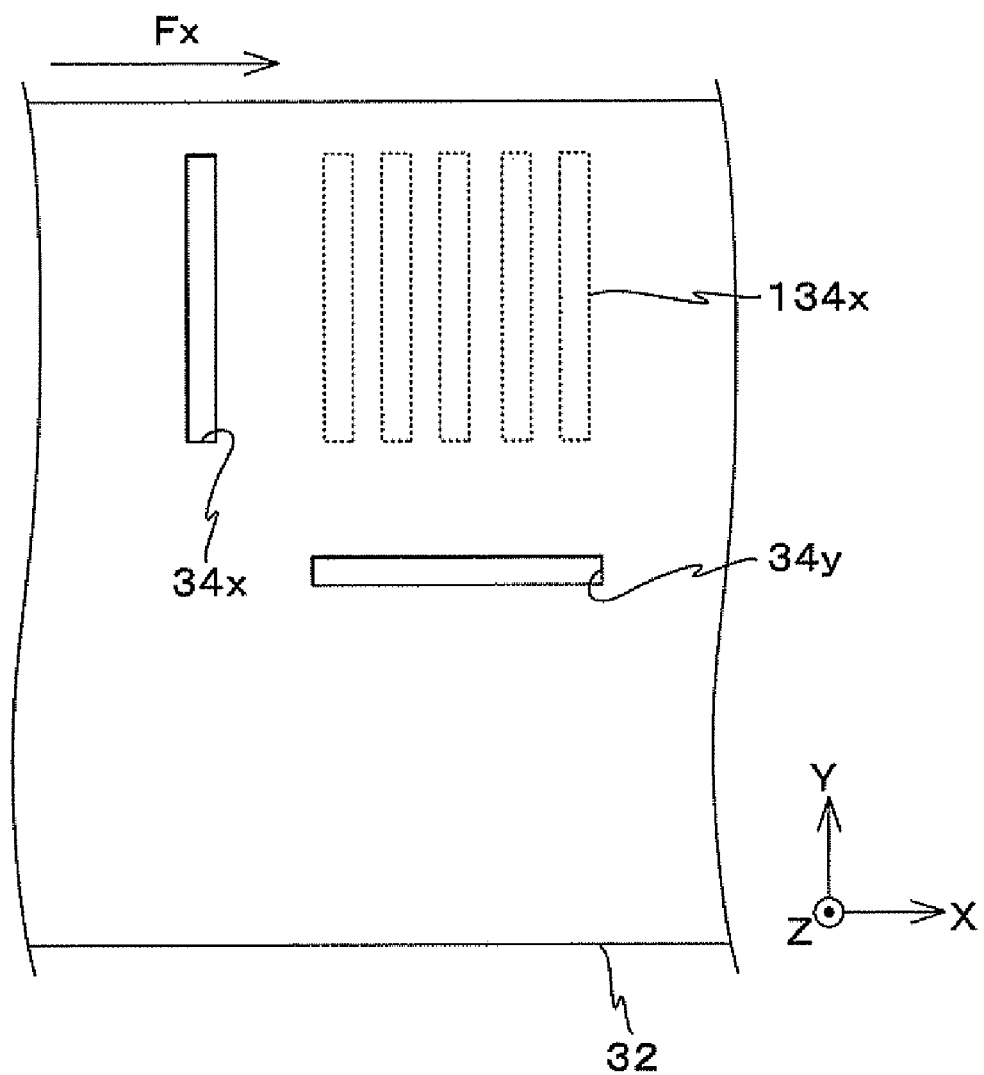
FIG. 7 is a view used to explain a measurement method of an aerial image $134x$.

Next, when the aerial image measurement using slit 34y has been completed, main controller 20 drives variable shaped mask VM via drive system 30 and forms an aerial image 134x of a line-and-space pattern having the periodic direction in the X-axis direction, as shown in FIG. 7, on slit plate 32. Then, main controller 20 moves stage ST in the +X direction (an arrow Fx direction) via stage drive system 40 so that the image of the pattern and slit 34x relatively move in the X-axis direction, and performs the aerial image measurement in the similar manner to the manner described above.

With the aerial image measurement performed in the manner described above, the image-forming position of the pattern image in the XY plane can be detected. In this case, as is described earlier, since the positional relation between aerial image 134y and projection optical system PL is constant at all times, measurement results of the light having passed through slit 34y (Y position information of the aerial image detected using laser interferometer 18Y) should be constant at all times.

On the other hand, in a case where the measurement results of the light having passed through slits 34y and 34x vary, it is predicted that the error occurs in the measurement result of laser interferometers 18Y and 18x due to the temperature variation in the atmosphere in the vicinity of stage ST, and therefore, calibration of the measurement values of laser interferometers 18Y and 18x is performed using the aerial image measurement results, in the present embodiment.

In this case, in this embodiment, during a period after exposure of one shot area column has been completed before exposure of a next shot area column is started, the aerial image measurement described above is performed and the calibration of laser interferometers 18x and 18Y are also performed, and therefore, movement control of stage ST is to be performed in the exposure operation of the next shot area column, using laser interferometers 18Y and 18x whose measurement values have been calibrated.

As is described above, according to this embodiment, during a period from the start of exposure to a plurality of shot areas subject to exposure on wafer W until the completion of the exposure, illumination light IL via pattern generating device 12 is received using aerial image measuring instruments 44 arranged on stage ST that holds wafer W, and information on the positional relation between illumination light IL and stage ST (and thus, the positional relation between illumination light IL and wafer W) is detected, and therefore, for example, even in a case where the peripheral atmosphere of stage ST changes and an error occurs in the measurement values in an interferometer, information on the error can be detected during a period from the start of exposure to a plurality of shot areas until the completion of the exposure. Accordingly, when performing the subsequent exposure operation, it becomes possible to achieve the exposure with high precision by taking the detection result into consideration (in this embodiment, by calibrating the interferometer). In particular, as in the present embodiment, even in a case where reciprocating scanning of wafer W need to be performed many times relative to exposure area IA and a comparatively long period of time is required for exposing one wafer, it is possible to achieve the exposure with high precision because the calibration of laser interferometers 18x and 18Y can be performed during a period from the start of exposure to one wafer to the completion of the exposure.

Further, according to this embodiment, the aerial image measurement is performed using aerial image measuring instruments 44 placed in the vicinity of wafer W, in the middle of the stepping in the X-axis direction, and therefore the throughput is hardly lowered, which makes it possible to achieve exposure with high precision.

Further, according to this embodiment, since a plurality of slit pairs 34 are arranged on slit plate 32, aerial image measuring instrument 44 located closest to the pattern image can be used to perform the aerial image measurement. Therefore, the movement distance of stage ST for the aerial image measurement can be shorter, compared with a case where slit pair 34 is arranged at only one position on stage ST, and also from this aspect, the throughput can be improved.

Further, according to exposure apparatus 100 of the present embodiment, drive system 30 sets the respective micromirrors of variable shaped mask VM in either the ON state or the OFF state. By performing the binary drive of the respective micromirrors in this manner, the processing algorithm in drive system 30 can be simplified, which allows the processing to be performed at higher speed. Furthermore, the increase in size and cost of drive system 30 can be restrained.

Incidentally, in the embodiment above, although a case has been described where the calibration of laser interferometers 18x and 18Y is performed using the measurement results obtained by aerial image measuring instruments 44, the present invention is not limited thereto, and for example, arrangement information (a coordinate system) of the shot areas obtained by the EGA described previously can be calibrated, using the measurement results of aerial image measuring instruments 44. Or, the position on the wafer of a pattern formed at variable shaped mask VM can be corrected (calibrated) by controlling the ON/OFF of the respective mirror elements of variable shaped mask VM using the measurement results of aerial image measuring instruments 44. The point is that movement control information of stage ST or information on the positional relation between illumination light IL and wafer W, which main controller 20 has, should be calibrated.

Further, in the embodiment above, while exposing one wafer, the aerial image measurement is performed using aerial image measuring instruments 44 and also the calibration of the interferometers is performed using the measurement results. However, this is not intended to be limiting, and it is also possible that only the aerial image measurement by aerial image measuring instruments 44 is performed while exposing one wafer, and various types of calibration is performed using the aerial image measurement results when exposing a next wafer or a wafer after a predetermined number of wafers.

Further, various types of the calibration methods described above can be combined as needed, for example, position control information of stage ST is calibrated while exposing one wafer and the calibration of the interferometers is performed when exposing a next wafer or a wafer after a predetermined number of wafers.

Further, in the embodiment above, although a case has been described where aerial image measuring instruments 44 are arranged on stage ST, aerial image measuring instruments 44 can be arranged on the wafer holder that holds wafer W on stage ST.

Incidentally, in the embodiment above, a case has been described where stage ST is scanned so that the slits and the aerial images relatively move when the aerial images are measured, but this is not intended to be limiting, and during the aerial image measurement, the pattern images can be moved relative to the slits while controlling pattern generating device 12 in a state where stage ST is stopped.

Incidentally, in the embodiment above, although a case has been described where the aerial image measurement is performed every time when one column of the shot areas is exposed, this is not intended to be limiting, the measurement can be performed every time when a predetermined number, which is not less than two, of columns of the shot areas are exposed. Further, the aerial image measurement can be performed with respect to each stepping. Moreover, the timing of the aerial image measurement can be set to various timings, such as, after a predetermined period of time, or when illumination light IL passes on a slit at first.

Further, in the embodiment above, a case has been described where the number of shot columns is 11, the aerial image measurement is performed every time when the exposure of one column has been completed, and the aerial image measurement is not performed before the exposure of the first column and after completion of the exposure of the final column. Therefore, the explanation is given assuming that the number of aerial image measuring instruments 44 is 20 in 10 pairs that correspond to the number (10 lines) of boundary lines between the shot columns. However, if the aerial image measurement is performed before the exposure of the first column and after completion of the exposure of the final column, then the number of aerial image measuring instruments 44 can be 24 in 12 pairs. Further, the timing of the aerial image measurement is not limited to once every time when the exposure of one shot column has been completed, but the aerial image measurement can be performed in the middle of the exposure of one shot column, and in such a case, 22 or more pairs of aerial image measuring instruments 44 can be arranged. Further, because the number of the shot columns is not limited to 11, the number of aerial image measuring instruments 44 can be determined regardless of the number of the shot columns. Furthermore, in the embodiment above, for example, slit pairs 34 and aerial image measuring instruments 44 are placed only on the +Y side of wafer W in FIG. 3, but slit pairs 34 and aerial image measuring instruments 44 can be placed also on the opposite side, i.e. the −Y side of wafer W.

Incidentally, in the embodiment above, although a case has been described where photodetector 38 is arranged within stage ST, this is not intended to be limiting, and it is also possible that photodetector 38 is placed outside stage ST and an illumination light having passed through the slits is guided to photodetector 38 via an optical fiber or the like. Further, one photodetector 38 does not have to be arranged for each slit, and for example, a configuration can be employed in which an optical fiber is arranged for the respective slits and a light from each of the optical fibers is guided to photodetector 38. In such a case, a switching mechanism that sets only a light from a given optical fiber to enter photodetector 38 can be arranged for each optical fiber.

Figure 8A:
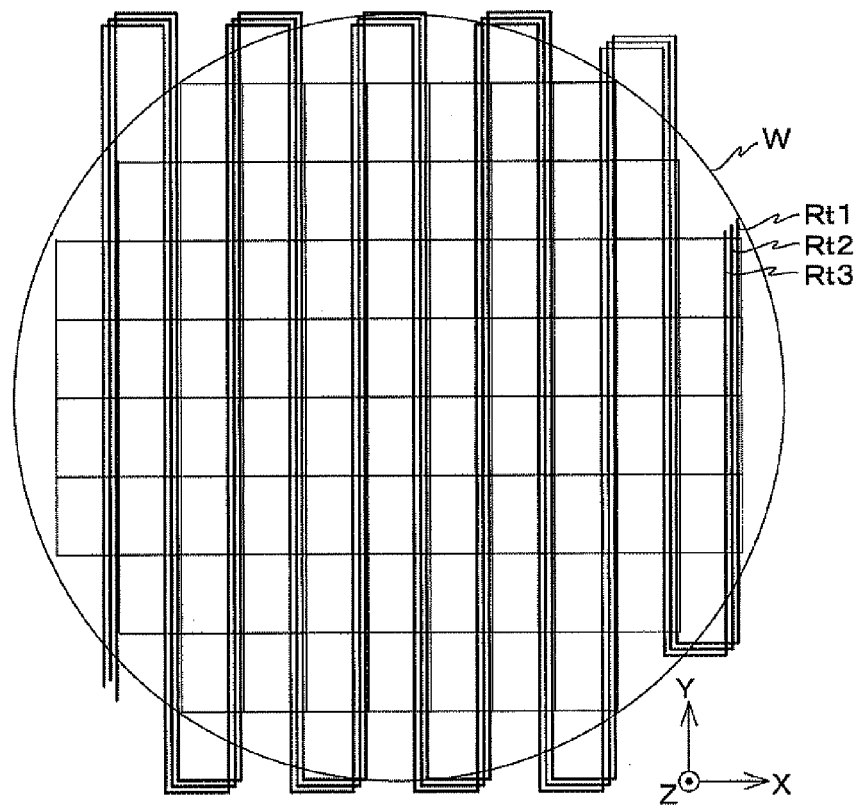
FIGS. 8A and 8B are views showing different examples of an exposure operation.
Figure 8B:
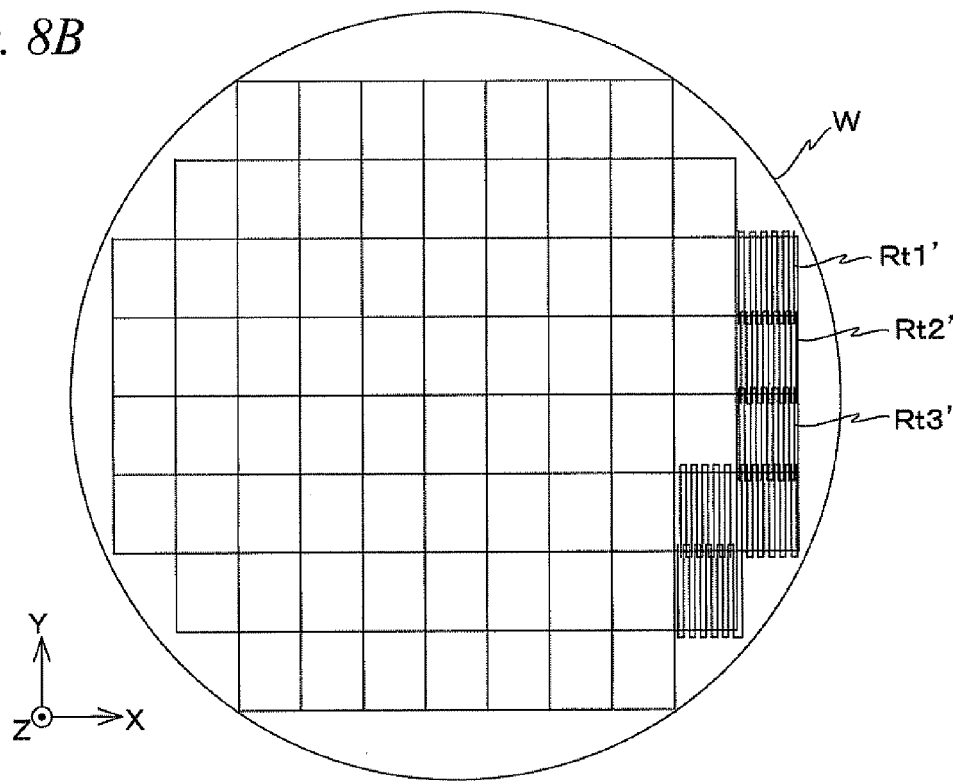

Incidentally, in the embodiment above, a case has been described where the exposure is performed while moving stage ST so that illumination light IL moves relative to stage ST along course Rt shown in FIG. 5, but this is not intended to be limiting, and as shown in FIG. 8A, all the shot areas on the wafer can be exposed, by exposing first a part of the respective shot areas along a course Rt1, then exposing another part of the respective shot areas along a course Rt2 that is shifted to the −X side by 0.2 mm from course Rt1, and further exposing a next part of the respective shot areas along a course Rt3 that is shifted to the −X side by 0.2 mm from course Rt2 and so on. Or, as shown in FIG. 8B, an exposure operation of sequentially exposing the respective shot areas can be performed by exposing first the entire area of one shot area along a course Rt1', then sequentially exposing the entire area of subsequent shot areas along courses Rt2' and Rt3' and so on. In either case, the aerial image measurement can be performed when illumination light IL (exposure area IA) passes on each slit pair 34 that configures the aerial image measuring instrument.

Incidentally, in the embodiment above, a case has been described where the light intensity is detected by photodetector 38 during the aerial image measurement, but this is not intended to be limiting, and for example, the amplitude of the light per unit time or unit area and the light quantity (an integrated value of the intensity in a predetermined period or a predetermined zone) can be detected.

Further, in the embodiment above, a case has been described where aerial image measuring instruments 44 are arranged at stage ST, but this is not intended to be limiting, and instead of aerial image measuring instruments 44, reflective marks can be arranged in the vicinity of wafer W on stage ST. For example, while measuring the XY position of stage ST with laser interferometers 18x and 18Y, an illumination light is irradiated on the reflective marks and the illumination light reflected off the reflective marks can be detected by another detection device. In such a case as well, a calibration operation such as calibration of the interferometers can be performed using detection results of the detection device. Further, not only the slit-shaped openings or the reflective marks, but also various types of patterns can be used as far as the positional relation between the exposure area and the stage (the wafer) can be detected.

Second Embodiment

A second embodiment of the present invention is described next, referring to FIGS. 9 and 22. Since an exposure apparatus related to the second embodiment has a configuration similar to that of the first embodiment described earlier, the same reference signs are used for the same or equivalent parts and the detailed description thereof is omitted herein, from the viewpoint of avoiding the redundant description. The exposure apparatus related to the second embodiment is different from that of the first embodiment in the point that main controller 20 computes control information with respect to drive system 30 in accordance with a pattern (a mask pattern) to be generated at variable shaped mask VM using templates (to be described later) in addition to the design data of a target pattern. In the description below, the different point from the first embodiment is mainly described.

Figure 10:
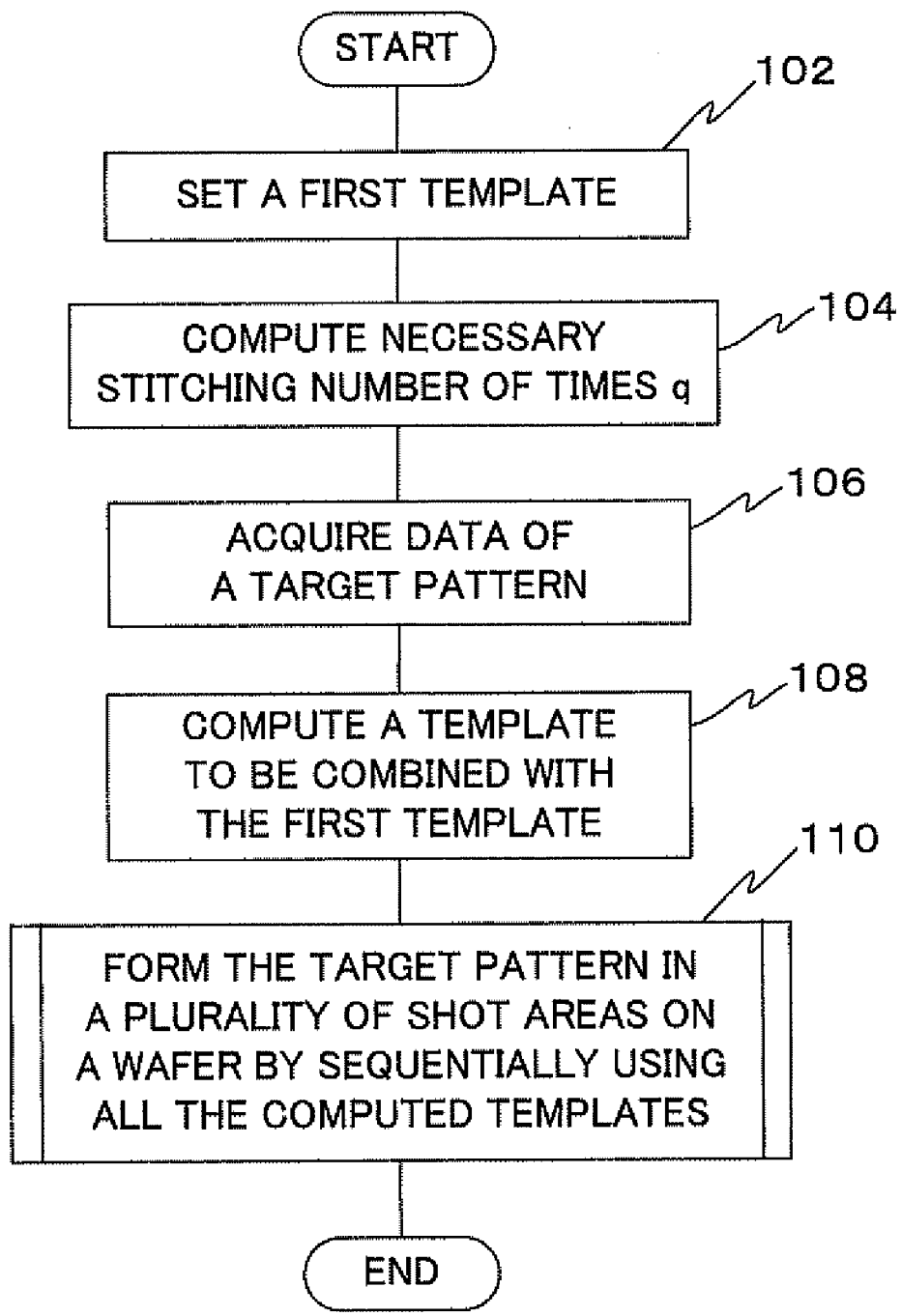
FIG. 10 is a flowchart showing a control algorithm of a main controller related to processing of forming a pattern image in a plurality of shot areas on the wafer in a second embodiment.
Figure 11:
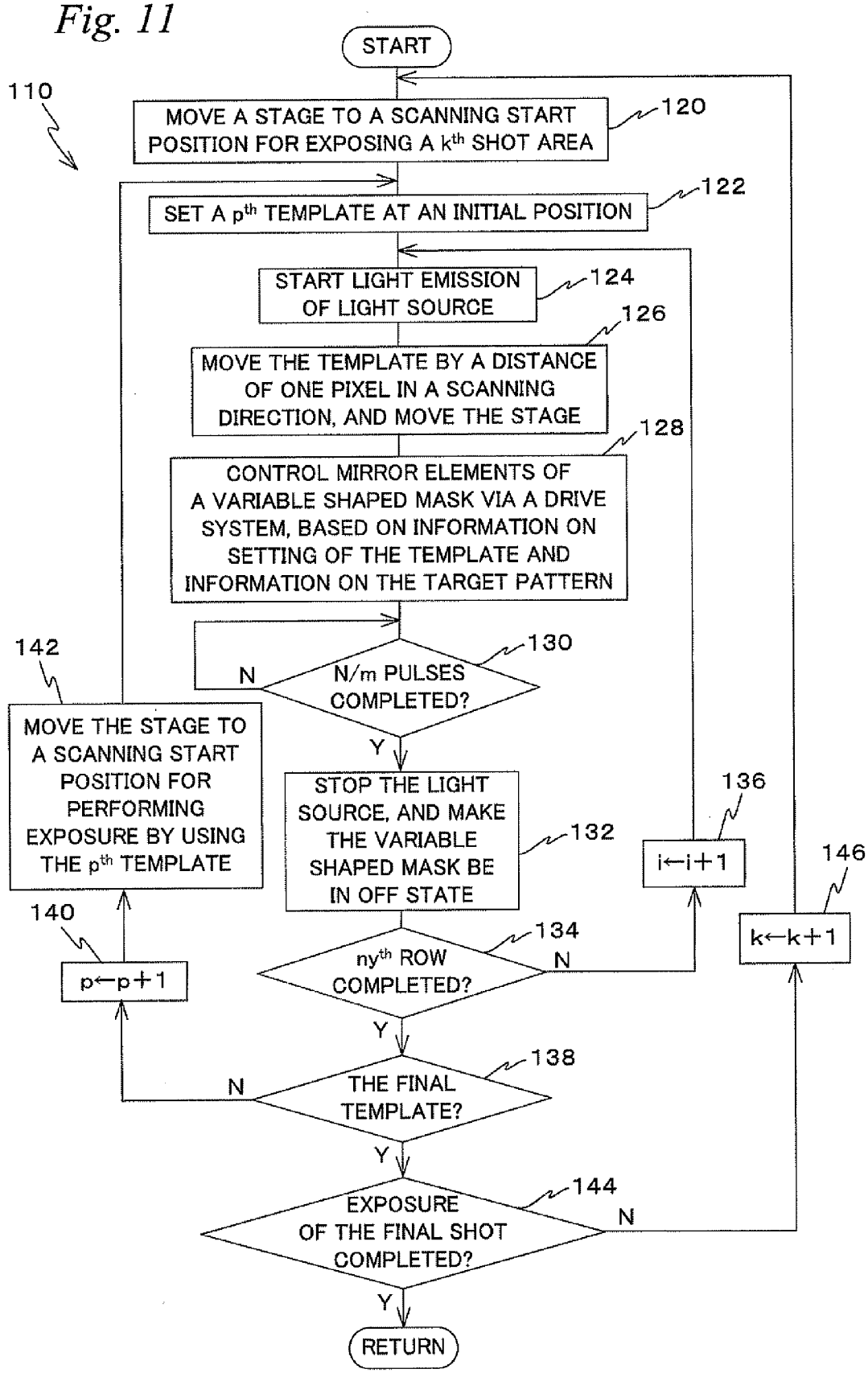
FIG. 11 is a flowchart showing an example of a subroutine 110 in FIG. 10.

Now, the processing of forming a pattern image in a plurality of, for example, the K-number of shot areas on wafer W, which includes computation of the control information for drive system 30 in accordance with the mask pattern is described, referring to flowcharts in FIGS. 10 and 11 that show a control algorithm of main controller 20.

First of all, several preconditions are described prior to the description of the specific processing.

Figure 9:
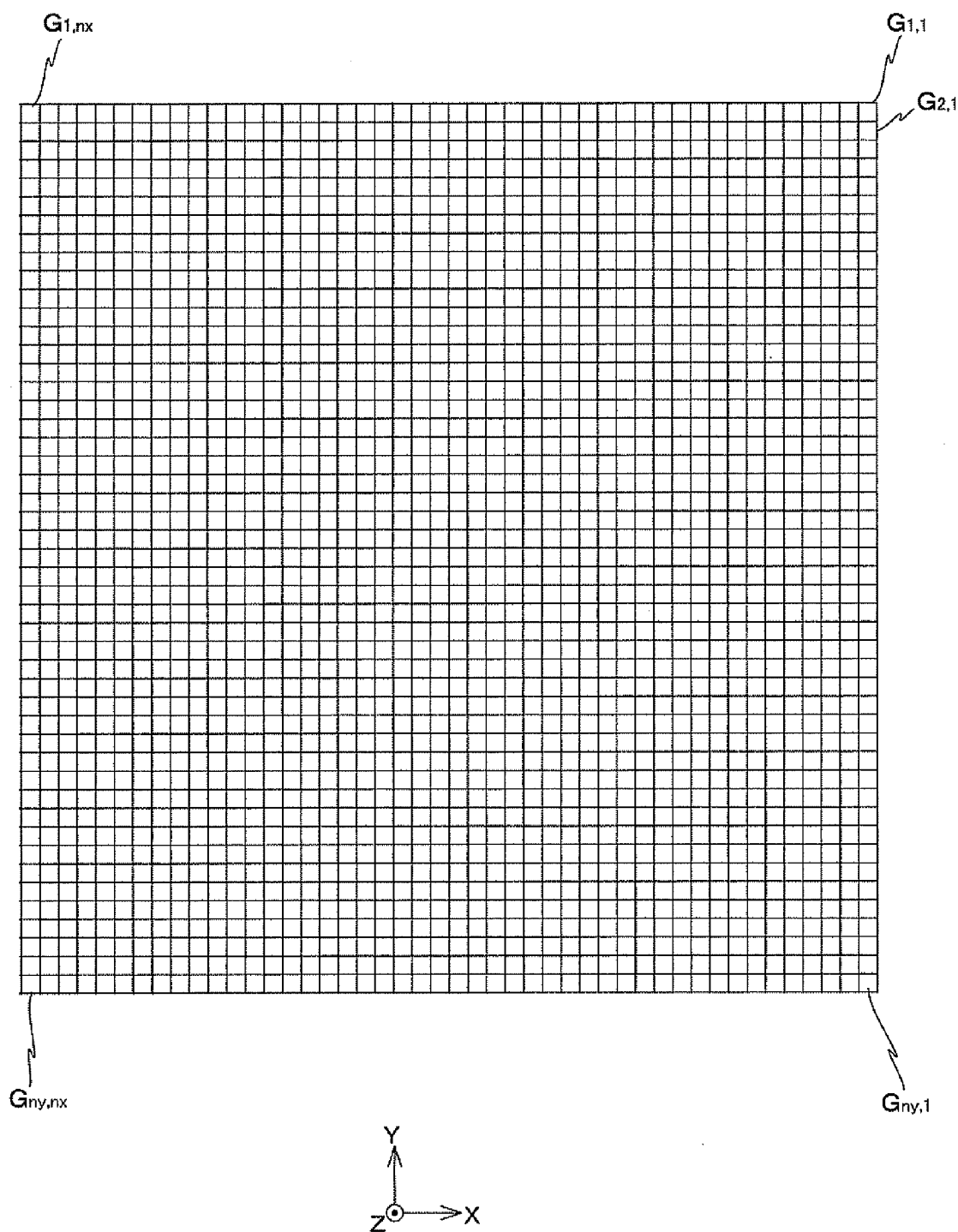
FIG. 9 is a view used to explain a two-dimensional pixel that is virtually set in a shot area on the wafer.

In this case, it is assumed that, as shown in FIG. 9 as an example, a two-dimensional pixel composed of a plurality of pixels placed in a matrix shape along the X-axis direction and the Y-axis direction is virtually set. Note that in this case, as an example, the number of pixels in the X-axis direction is assumed to be nx number and the number of pixels in the Y-axis direction is assumed to be ny number, and each pixel is denoted by $G_{i,j}$ (i=1 to ny, j=1 to nx). Note that the −X direction is assumed to be a direction in which "j" increases, and the −Y direction is assumed to be a direction in which "i" increases.

Further, the size of each mirror element of variable shaped mask VM multiplied by the projection magnification of projection optical system PL is assumed to coincide with the size (the pixel pitch) of each pixel $G_{i,j}$. Note that the size of pixel is, for example, 70 nm×70 nm.

Moreover, the pattern image is assumed to be formed on wafer W by irradiation of illumination light IL with N pulses, e.g. N=50 pulses. Further, it is assumed that formation of the pattern image is performed under the illumination conditions of the numerical aperture N.A.=0.95 of projection optical system PL, σ (coherence factor)=0.90 and an annular ratio (Ann)=2/3.

Figure 12A:
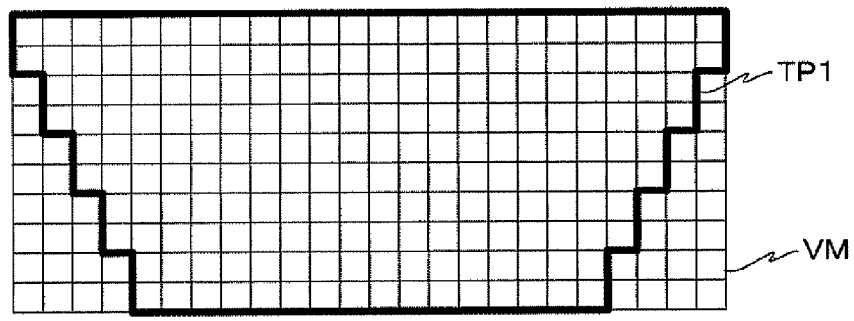
FIGS. 12A, 12B and 12C are views showing templates TP1, TP2 and TP3, respectively.

First of all, in step 102 in FIG. 10, main controller 20 sets a first template that defines a use area (an area of micromirrors subject to ON/OFF control) of variable shaped mask VM, for example, a template that defines the maximum use area of variable shaped mask VM in a non-scanning direction. As a consequence, a template TP1 having a vertically-inversed isosceles trapezoidal shape as shown in FIG. 12A is set, as an example, with respect to variable shaped mask VM (the micromirror group). In this case, template TP1 can be set in the following manner. That is, a plurality of templates having different shapes and sizes are prepared in advance within a memory (not shown) and template TP1 is selected from among the templates. Or, template TP1 can be created by changing the shape of a basic template based on the arrangement and the number of the micromirror group of variable shaped mask VM.

Next, in step 104, main controller 20 computes how many times the stitching needs to be made in the non-scanning direction within a shot area, based on the relation between the width in the non-scanning direction of an area, on wafer W, that can be exposed at one time using variable shaped mask VM (corresponding to the width of template TP1 and the number of pixels of template TP1 in the non-scanning direction) and the width of the shot area in the scanning direction. The necessary number of times of stitching is assumed to be "q". In this case, "q" is assumed to be 2, for the sake of simplified description.

Figure 13:
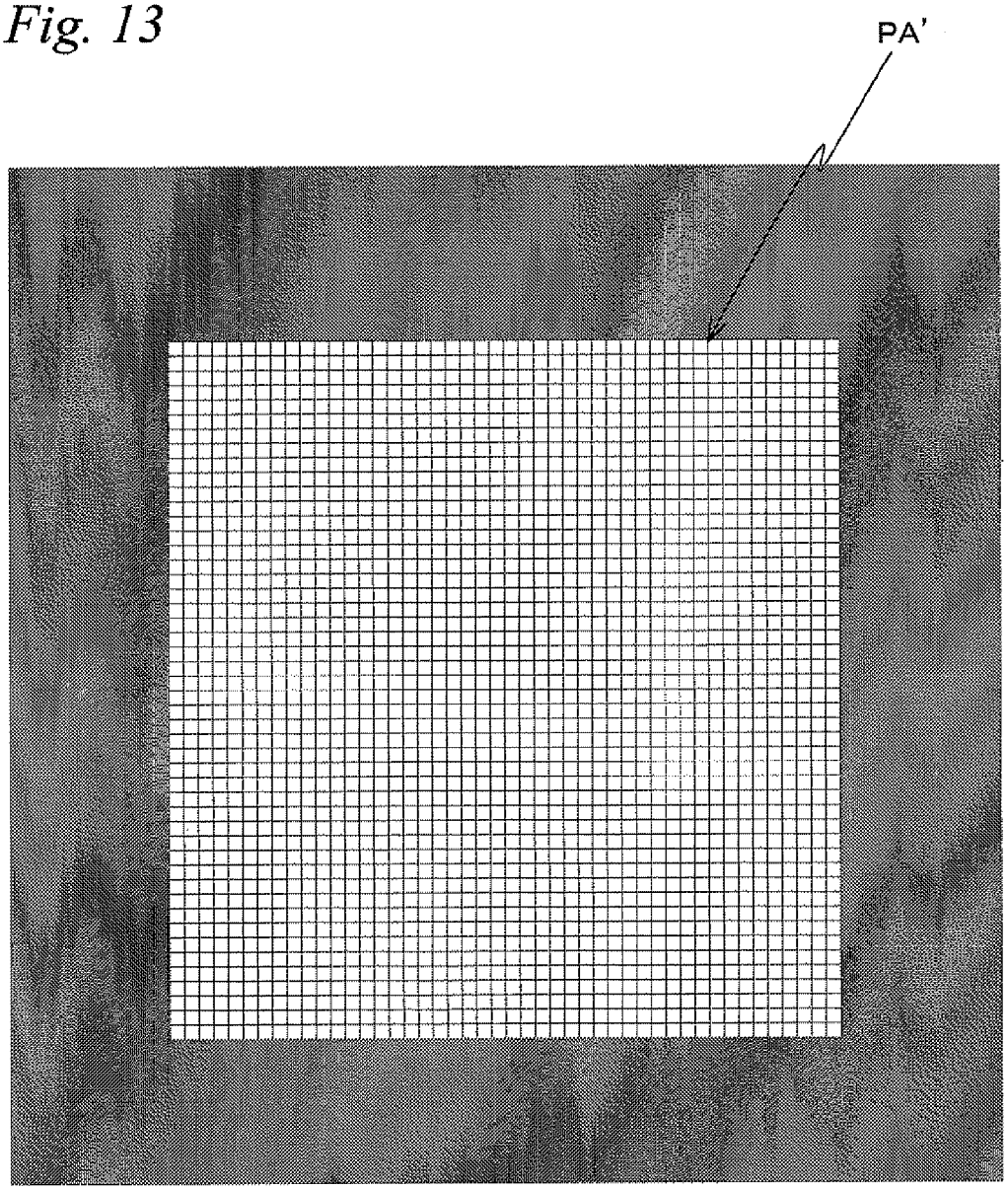
FIG. 13 is a view showing a virtual pattern area (two-dimensional pixel area) PA' composed of a plurality of pixels placed in a matrix shape.

Next, in step 106, main controller 20 acquires, from a higher-level device, data of a target pattern in which 0 or 1 is respectively allocated to each of a plurality of pixels placed in a matrix shape shown in FIG. 13 (a virtual pattern area (a two-dimensional pixel area) PA' made up of ny×nx pixels (which corresponds to the two-dimensional pixel in FIG. 9)). The periphery of virtual pattern area PA' is covered with a light-shielding pattern having a rectangular shape in which 0 is allocated to all pixels. In the description below (including the illustration in the drawings), a light-shielding section is indicated by 0 or gray color, and a light-transmitting section is indicated by 1 or white color.

Figure 14:
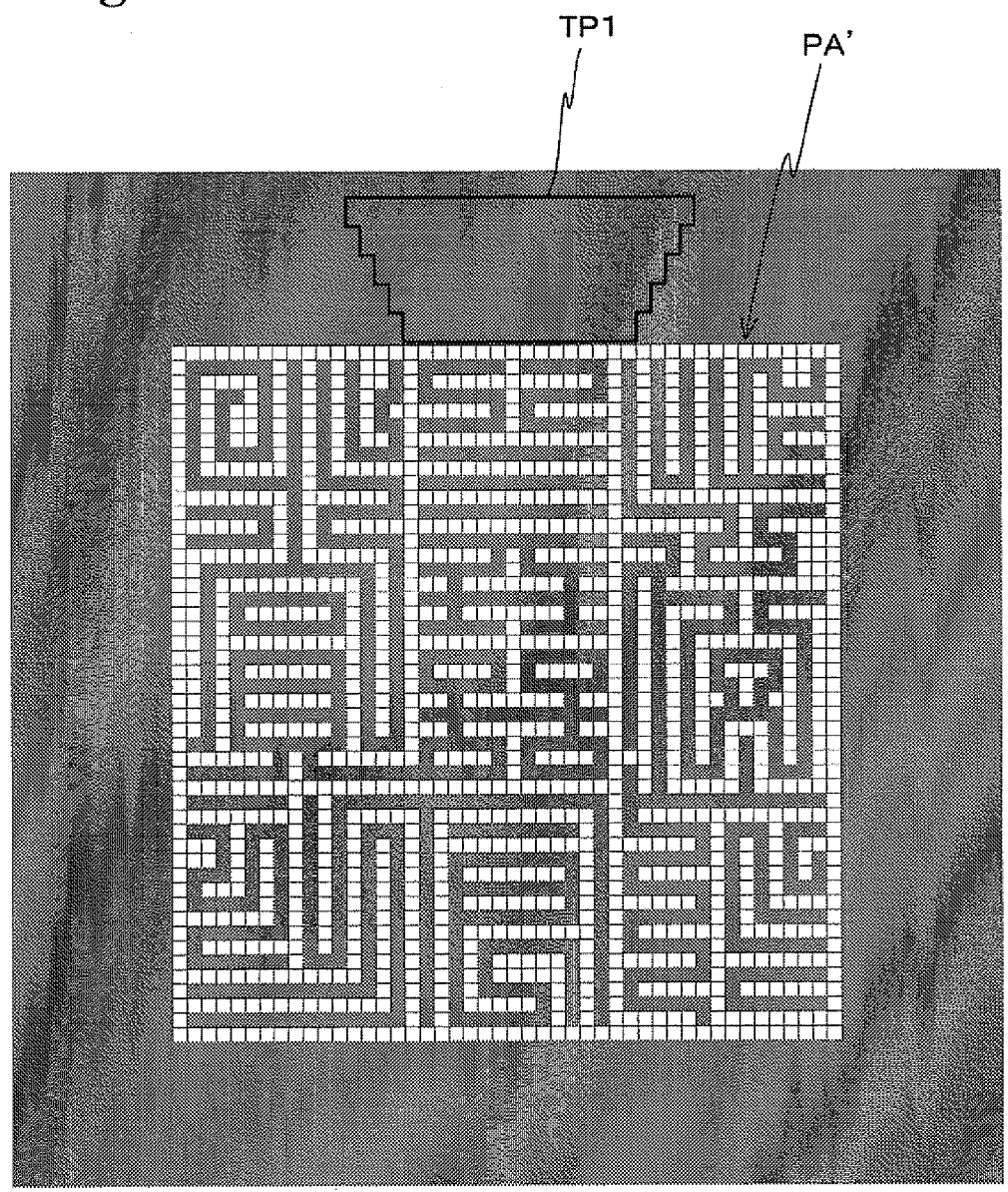
FIG. 14 is a view showing an example of a target pattern.

Main controller 20 acquires data of the target pattern as shown in FIG. 14, as an example.

Next, in step 108, main controller 20 computes a template which should be combined with the first template (template TP1), based on the width (the pixel number) of virtual pattern area PA' in the non-scanning direction and the width (the pixel number) of template TP1 in the non-scanning direction, and the number of times q(β2) described above. In this case, a predetermined computation is performed by main controller 20 based on the shape and size of template TP1 and the width of virtual pattern area PA' in the non-scanning direction, and a template TP2 shown in FIG. 12B and a template TP3 shown in FIG. 12C are computed.

Figure 15A:
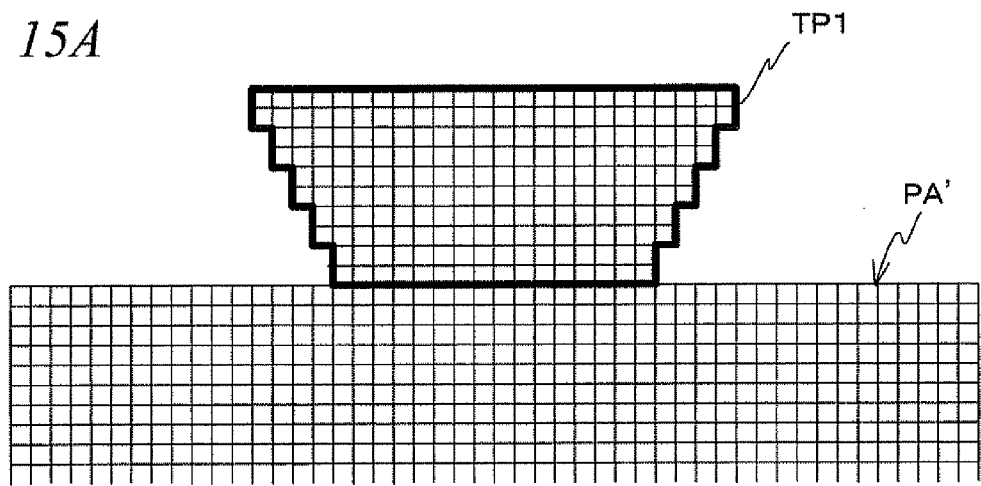
FIGS. 15A, 15B and 15C are views respectively showing a state where template TP1, templates TP1 and TP2, and templates TP1 to TP3 is/are set adjacent to one end edge in a direction corresponding to a scanning direction of virtual pattern area PA'.
Figure 15B:
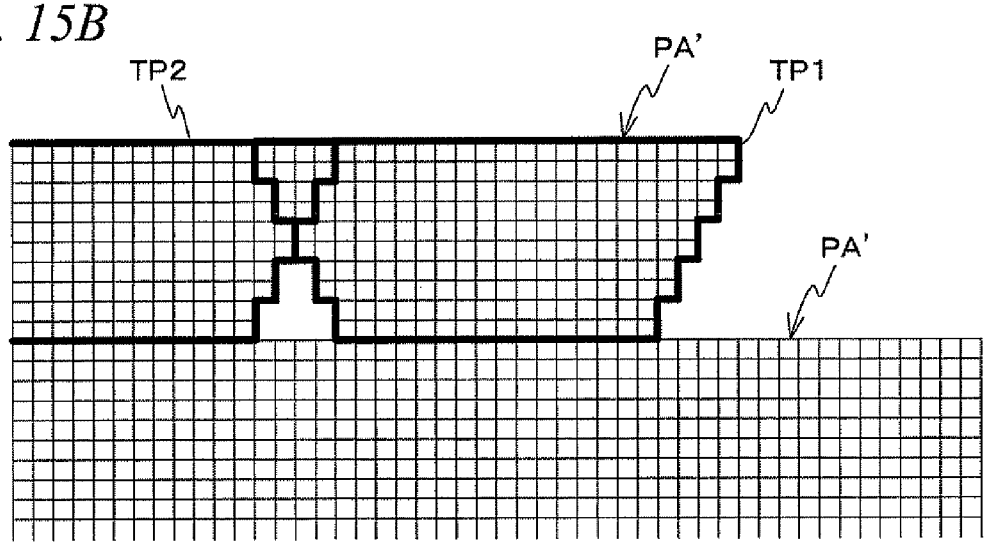

More specifically, as shown in FIG. 15A, main controller 20 sets template TP1 to be adjacent to one edge of virtual pattern area PA' in a direction corresponding to the scanning direction, in the center portion in the non-scanning direction on the outside of virtual pattern area PA'. And, as a template that should be stitched with template TP1, main controller 20 computes template TP2 shown in FIG. 15B, which forms a predetermined overlap area between the templates at one side end of template TP1 in the non-scanning direction. Similarly, as a template that should be stitched with template TP1, main controller 20 computes template TP3 shown in FIG. 15C, which forms a predetermined overlap area between the templates at the other side end of template TP1 in the non-scanning direction.

Figure 12B:
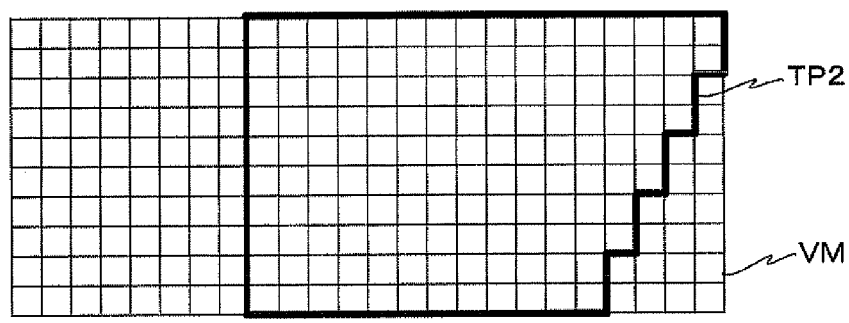
Figure 12C:
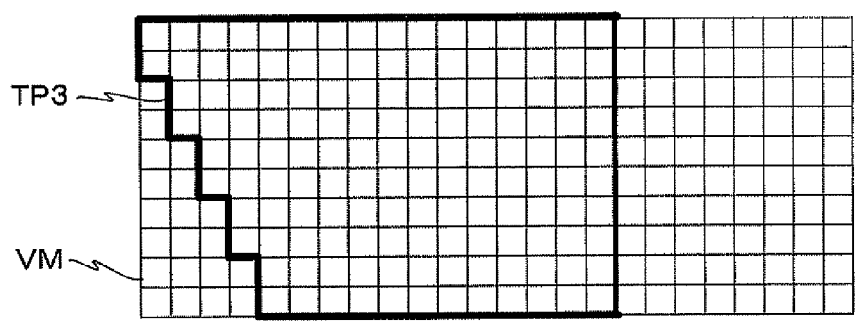

The state where template TP2 or TP3 is set in variable shaped mask VM is shown in FIGS. 12B and 12C, respectively. Instead of at least one of templates TP1, TP2 and TP3, a template obtained by reversing these templates in a direction corresponding to the scanning direction can be used. Note that if template TP1 is vertically reversed in FIG. 15C, then a rectangular (oblong) area is formed by templates TP1, TP2 and TP3 without any spacing and overlapping therebetween. In other words, based on template TP1 set adjacent to the one edge of virtual pattern area PA' in the direction corresponding to the scanning direction, templates TP2 and TP3 that satisfy such conditions are computed.

Now, the reasons why templates having the shape like templates TP1, TP2 and TP3 are used are described.

In a case where a plurality of rectangular templates are placed to be adjacent to each other, there is a risk that a level difference is generated between the stitching sections. Further, in a case where a plurality of rectangular templates are partly overlapped in the non-scanning direction, if the micromirrors in the overlap area between the templates are in the ON state at all times when any template(s) is/are used, then the exposure dose in the overlap area is excessively higher than that in other areas. Thus, the rectangular templates are inappropriate for the joint exposure (stitching exposure). This is the first reason.

Figure 16A:
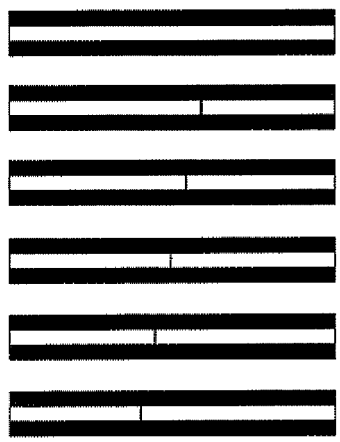
FIG. 16A is a view used to explain a case of forming a resist image of a horizontal line pattern by quintuple exposure.

Further, a case is considered where a resist image having a lateral line pattern as shown in the uppermost row in FIG. 16A is formed on wafer W by quintuple exposure (the exposure dose per each time is ⅕ of the normal exposure) using the combination of the patterns shown in the second to sixth rows in FIG. 16A. In this case, the resist image of the lateral line pattern as shown in the uppermost row in FIG. 16A can be obtained by the quintuple exposure regardless of the positions of stitches between the respective lateral line patterns.

Figure 16B:
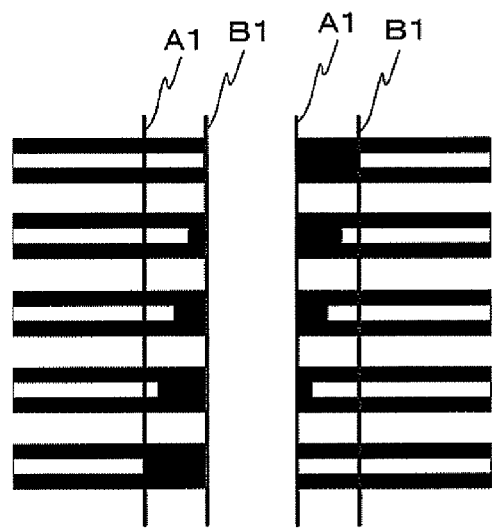
FIGS. 16B and 16C are views each showing an example of a combination of patterns that partly have overlap areas between the patterns, the combination being equivalent to a combination of patterns in second to sixth rows shown in FIG. 16A.

Next, when the combination of patterns partly having overlap areas between the patterns, which is equivalent to the combination of the patterns in the second to sixth rows in FIG. 16A, is considered, the combination of the patterns as shown in the first to fifth rows shown in FIG. 16B is conceivable. If the quintuple exposure (the exposure dose per each time is ⅕ of the normal exposure) is performed while overlapping the sections in between lines A1 and B1 by using the combination of these patterns, the exposure doses at any points are of the same value and the stitching exposure can accurately be performed.

Figure 16C:
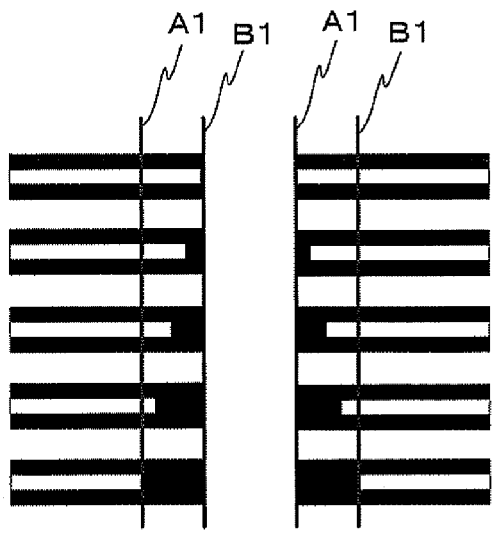

Further, as another example of the combination of patterns partly having overlap areas between the patterns, which is equivalent to the combination of the patterns in the second to sixth rows shown in FIG. 16A, the combination of patterns as shown in the first to fifth rows in FIG. 16C is conceivable. The combination in FIG. 16C is nothing but the combination obtained by vertically reversing the set of the patterns on the right-hand side in FIG. 16B. Accordingly, when the quintuple exposure (the exposure dose per each time is ⅕ of the normal exposure) is performed while overlapping the sections in between lines A1 and B1 by using the combination of these patterns, the exposure doses at any points are of the same value and the stitching exposure can accurately be performed.

More specifically, the templates having the shape like templates TP1, TP2 and TP3 are used in order to perform the stitching exposure by multiple exposure, which uses the combination of the patterns partly having the overlap area between the patterns, similar to the case of FIG. 16C. The point that the stitching exposure by multiple exposure having the overlap area between the patterns, by using templates TP1, TP2 and TP3 is further described later on.

Next, in step 110, main controller 20 moves the procedure to a subroutine in which the target pattern is formed in a plurality of (e.g. the K number) on a wafer, sequentially using all the computed templates.

Now, prior to the description of the processing of the subroutine, the control principle of each micromirror of variable shaped mask VM using the templates is described.

Figures 17A, 17B, 17C:
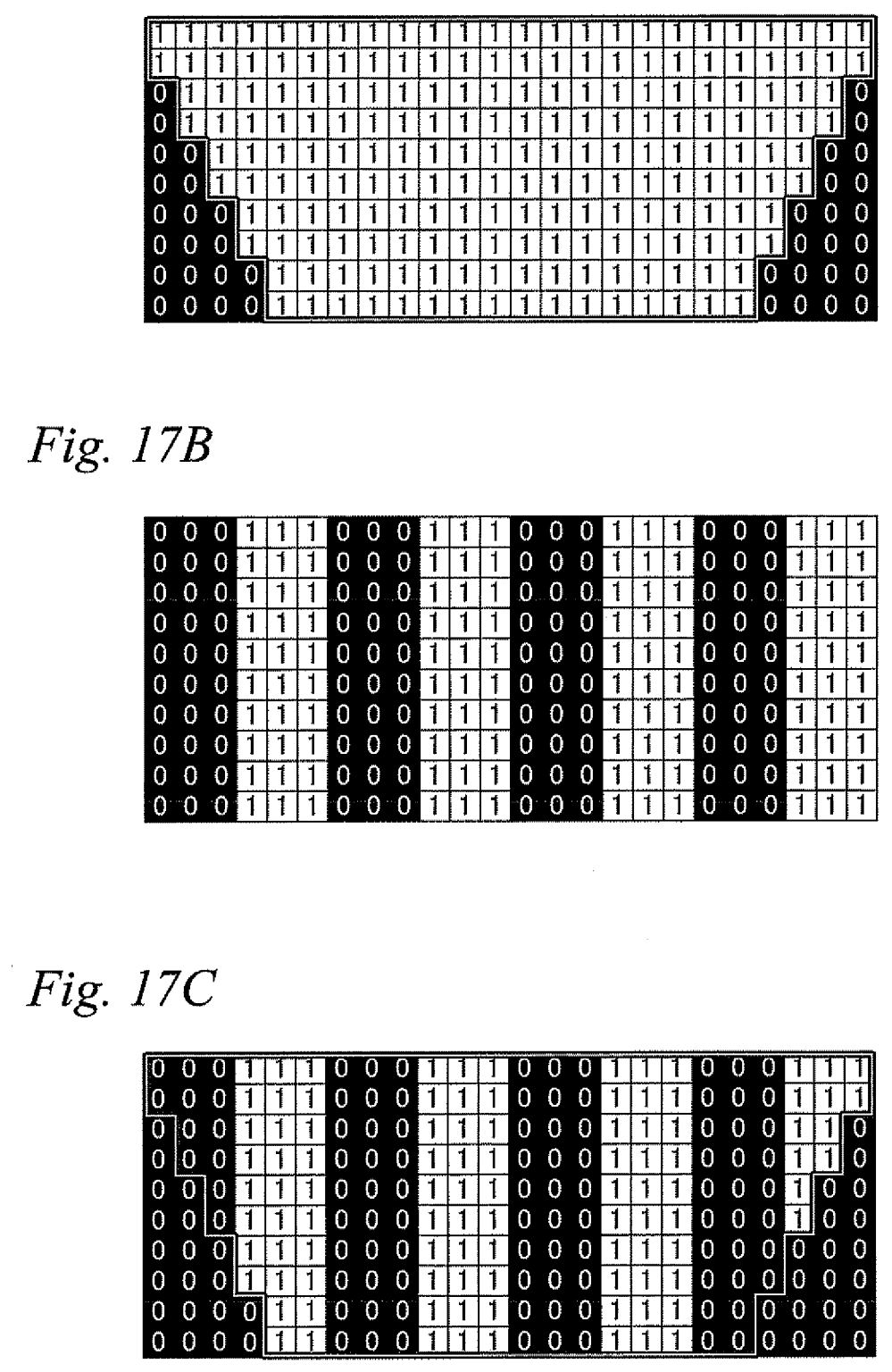

FIG. 17A shows template TP1 described earlier which is set in variable shaped mask MV, FIG. 17B shows an example of pattern data (mask data), and FIG. 17C shows output data that is output from main controller 20 to drive system 30 in a case where template TP1 is set.

As is obvious when comparing FIGS. 17A to 17C, the product of the value of each pixel (micromirror) in FIG. 17A (all the values inside the template are "1" and all the values outside the template are "0") and the value of a pixel of the corresponding pattern data (the dark section is indicated by "0" and the bright section is indicated by "1") is the output data with respect to each pixel (micromirror).

In this case, based on the output data "0", drive system 30 gives an OFF signal that makes corresponding micromirrors be in the OFF state to the drive mechanisms of the micromirrors, and based on the output data "1", drive system 30 gives an ON signal that makes corresponding micromirrors be in the ON state to the drive mechanisms of the micromirrors. Consequently, as can be seen from FIG. 17C, only the data in the bright section of the mask pattern inside template TP1 is taken out, only the micromirrors corresponding to the bright section come into the ON state, and the other micromirror come into the OFF state.

Prior to starting the processing of subroutine 110, main controller 20 initializes all of a count value i of a first counter, a count value p of a second counter and a count value k of a third counter to "1", which will be described later. In this case, count value i denotes the row number of virtual pattern area PA' described above, count value p denotes what number the template is, and count value k denotes the order of shot areas subject to exposure.

In subroutine 110, first of all, main controller 20 moves stage ST to a scanning start position for exposure of a $k^{th}$ (first in this case) shot area on wafer W, in step 120 shown in FIG. 11.

Next, main controller 20 sets a $p^{th}$ (first in this case) template TP1 at an initial position (in this case, the position shown in FIG. 15A described previously) in step 122 (see FIG. 14).

Next, main controller 20 starts emission of the light source in step 124. However, at this point in time, all the micromirrors of variable shaped mask VM are in the OFF state, and therefore, the $0^{th}$-order diffraction light (and the $1^{st}$-order diffraction light) from the micromirrors hardly enter(s) projection optical system PL.

Next, in step 126, main controller 20 moves the this case, first) template, by a distance of one pixel in the scanning direction, relative to virtual pattern area PA', and moves stage ST in synchronization with the movement of the template.

Next, in step 128, main controller 20 performs the ON/OFF control of the respective micromirrors of variable shaped mask VM via drive system 30, based on information on setting of the template and information on the target pattern. During this operation, main controller 20 supplies the control signal to make only the micromirrors corresponding to the bright section of the target pattern inside the template be in the ON state and make the other micromirrors be in the OFF state. Accordingly, only the micromirrors corresponding to the pixels of the bright section inside the template are in the ON state and an image of a pattern formed by reflected diffraction lights from the micromirrors in the ON state is formed on wafer W via projection optical system PL.

Then, in the next step, step 130, main controller 20 waits until irradiation of illumination light IL of N/m pulses, in this embodiment, 50/10=5 pulses to variable shaped mask VM has been completed. And, when the irradiation of illumination light IL of N/m pulses has been completed, the procedure proceeds to step 132, in which main controller 20 stops the emission of the light source, and at the same time, makes all the micromirrors of variable shaped mask VM be in the OFF sate.

Next, in step 134, main controller 20 judges whether or not exposure of the $ny^{th}$ row of the two-dimensional pixel within the shot area has been completed by using the $p^{th}$ template, with reference to count value i of the first counter. In this case, since i is equal to 1, the negative judgment is made herein, and main controller 20 increments count value i by 1 (i←i+1) in step 136. Then, the processing in step 124 and the subsequent steps is repeated, and when the affirmative judgment is made in step 134, main controller 20 moves the procedure to step 138. In step 138, main controller 20 judges whether or not the currently set template is a final template by referring to count value p of the second counter. In this case, since p is equal to 1, the judgment in this step is negative, and main controller 20 increments count value p by 1 (p←p+1), and then makes the procedure proceed to step 142. In step 142, after moving stage ST in the XY two-dimensional directions so as to set the $k^{th}$ shot area on wafer W at the optimal initial position for starting exposure (this position is a position which is moved by a predetermined distance in the X-axis direction from the scanning start position set in step 120) by using the $p^{th}$ template and variable shaped mask VM, main controller 20 returns the procedure to step 122.

Then, main controller 20 repeats the processing in steps 122 to 140 until the judgment in step 138 becomes affirmative. Accordingly, the setting positions of template TP2 and TP3 on virtual pattern area PA' are changed by a distance of one pixel in the scanning direction by main controller 20 so that each of templates TP2 and TP3 is scanned in the scanning direction relative to virtual pattern area PA' to which data (0 or 1) of the target pattern is allocated, and formation of the target pattern on wafer W using variable shaped mask VM is performed And, when exposure of the $ny^{th}$ row of the two-dimensional pixel within the shot area has been completed by using the final template (TP3), the judgment in step 138 becomes affirmative, and the procedure proceeds to step 144. In step 144, main controller 20 judges whether or not the exposure of a final shot area on wafer W has been completed, by referring to count value k of the third counter. In this case, since k is equal to 1, the judgment herein is negative and count value k is incremented by 1 (k←k+1) in step 146, and then the procedure returns to step 120, and afterword, formation of the target pattern is performed by the scanning exposure described earlier to each of the second to $k^{th}$ shot areas, by repeating the processing in step 120 and the subsequent steps described above.

Then, when formation of the target pattern to the $K^{th}$ shot area on wafer W has been completed, the processing in subroutine 110 is finished, the procedure returns to the main routine, and a series of the processing in the main routine is completed.

Figures 18, 19B, 19C, 19D, 19E, 19F, 19I, 19J, 19K, 19L, 19M:
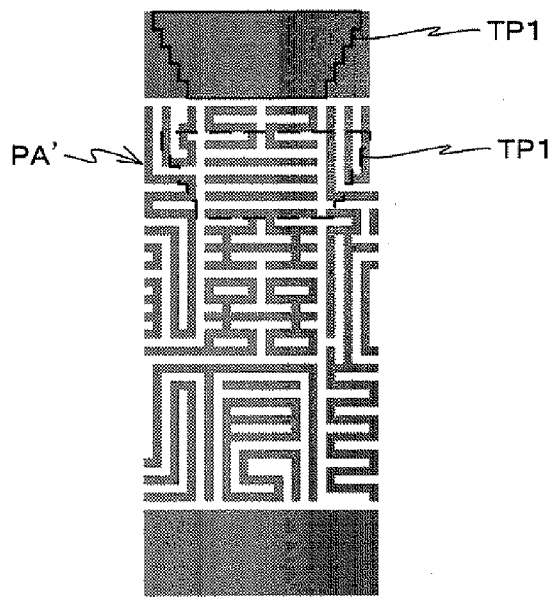
FIG. 18 is a view used to explain a state where a setting position of template TP1 changes, and showing a first position outside virtual pattern area PA' and a second position inside virtual pattern area PA'.
Figure 19A:
FIGS. 19A to 19N are views showing a changing state of pattern data extracted when the setting position of template TP1 is changed, by a distance of one pixel, on virtual pattern area PA' from the first position outside the pattern area shown in solid lines in FIG. 18 to the second position inside the pattern area shown in broken lines in FIG. 18.
Figure 19G:
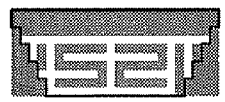
Figure 19H:
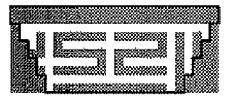
Figure 19N:
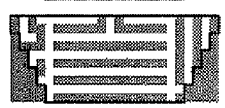

FIGS. 19A to 19N show the state of the change in the pattern data taken out when the setting position of template TP1 is changed, by a distance of one pixel (see FIG. 14), from the first position outside pattern area shown in solid lines in FIGS. 14 and 18 to the second position in the pattern area shown in dotted lines in FIG. 18. Focusing on the line pattern (bright section) on the uppermost end of virtual pattern area PA', it can be found that the length of this line pattern gradually increases according to the position change of template TP1. However, this line pattern is originally a part of the outermost peripheral frame of virtual pattern area PA' and is much longer than the length of template TP1. Accordingly, this line pattern is subject to stitching exposure using templates TP1 to TP3 (see FIG. 14).

Figure 15C:
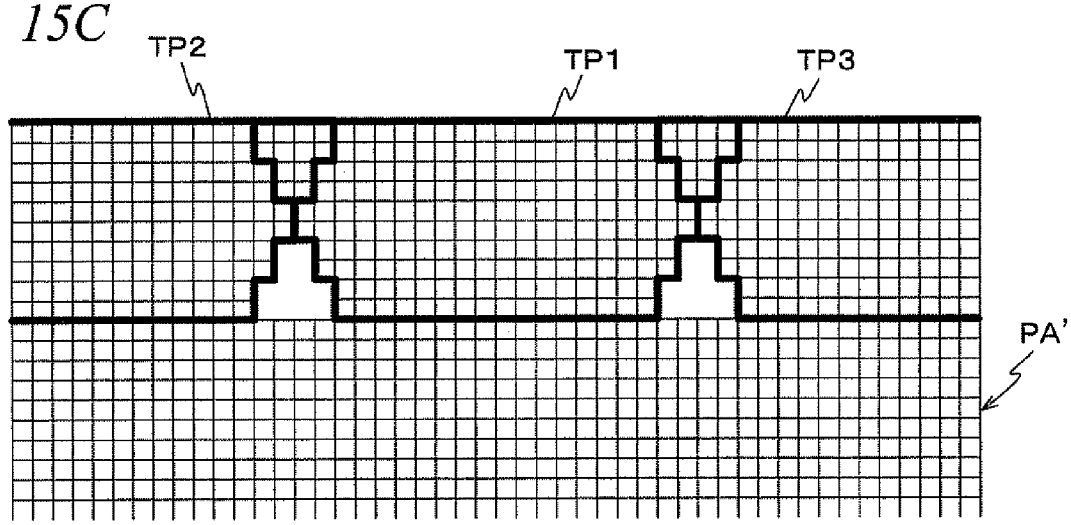

Consequently, main controller 20 also changes the setting position of template TP2 from the position shown in FIG. 15C by a distance of one pixel (see FIG. 14) on virtual pattern area PA', and at the respective setting positions, supplies the control signal to make the micromirrors corresponding to the bright section of the target pattern inside the template be in the ON state and make the other micromirrors in the OFF state, to drive system 30, as is described earlier. Further, main controller 20 also changes the setting position of template TP3 from the position shown in FIG. 15C by a distance of one pixel (see FIG. 14) on virtual pattern area PA', and at the respective setting positions, supplies the control signal to make the micromirrors corresponding to the bright section of the target pattern inside the template be in the ON state and make the other micromirrors in the OFF state, to drive system 30, as is described earlier.

In the second embodiment, by changing the setting positions of templates TP1, TP2 and TP3 respectively by a distance of one pixel in the manner described above and performing the exposure at the respective positions, main controller 20 performs multiple exposure partly having the overlap areas, while gradually changing the length of the line pattern within the overlap areas, which is similar to the case of FIG. 16B or 16C described earlier, and thus forming the line patterns and other patterns on wafer W.

According to the second embodiment as described above, the apparatus configuration equivalent to that in the first embodiment described earlier is equipped, and therefore, the equivalent effect can be obtained. Further, based on the information on the target pattern (data of the target pattern) and information on setting of the templates (e.g. TP1, TP2 and TP3) that define the use area (i.e. the area of the micromirrors subject to the ON/OFF control) of variable shaped mask VM, main controller 20 controls a plurality of micromirror mechanisms $M_{ij}$ (i=1 to m, j=1 to n) of variable shaped mask VM, and as a consequence, the target pattern is formed in the shot area on wafer W by stitching of the patterns generated by variable shaped mask VM.

Main controller 20 sets a plurality of templates (e.g. TP1, TP2 and TP3) having shapes that can be placed adjacent to each other without spacing therebetween and also without overlapping with each other, within virtual pattern area PA' in which the target pattern is formed, in a state where the overlap areas exist in a part of the templates. Then, main controller 20 sequentially controls a plurality of micromirror mechanisms $M_{ij}$ of variable shaped mask VM based on the information on setting of the respective templates and the information on the target pattern. Accordingly, the overlap areas are present in the part of the stitching sections of the patterns to be formed on wafer W, and the level difference between the stitching sections is prevented from arising, which also makes it possible to form the target pattern in the shot area on wafer W with high precision.

Note that the necessary stitching number of times q is assumed to be 2 in the second embodiment, for the sake of simplified description, but in a case where the width of the shot area in the X-axis direction is 26 mm and the width of exposure area IA in the X-axis direction is 0.2 mm, the necessary stitching number of times is over 129 times (the overlap areas between the templates are necessary). In this case, templates similar to templates TP2 and TP3 can be set on both ends in the non-scanning direction and a template similar to template TP1 can be set on the portions other than both ends, with the overlap width similar to the width described above.

Figure 20A:
FIGS. 20A to 20H are views respectively showing different examples of combination of the templates.
Figure 20B:
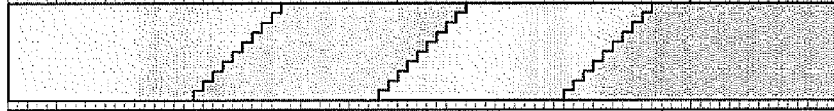
Figure 20C:
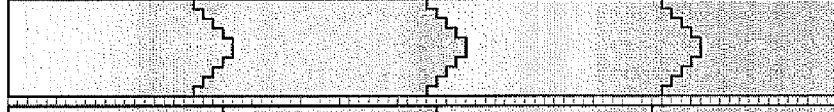
Figure 20D:

Incidentally, the combination of the templates described in the second embodiment above is merely an example, and the present invention is not limited to this combination. For example, as shown in FIGS. 20A to 20D, the combinations of templates, with which overlap area between adjacent templates are not generated, can be employed. Of these combinations, the combination of templates in FIG. 20A is obtained by combining a plurality of trapezoidal templates, which are alternately reversed in the vertical direction, without spacing and an overlap area between the templates. The combination of templates in FIG. 20B is obtained by combining trapezoidal templates on both ends and a plurality of parallelogram templates in between the trapezoidal templates without spacing and an overlap area between the templates. The combination of templates in FIG. 20C is obtained by combining a plurality of templates each having a shape like a combination of parallelograms or trapezoids (on both ends) which are vertically reversed with respect to the center in the height direction (scanning direction) in the drawing, without spacing and an overlap area between the templates. The combination of templates in FIG. 20D is obtained by combining a plurality of templates each having a shape like a combination of parallelograms or trapezoids (on both ends) which are vertically reversed alternately with respect to the boundaries dividing the height direction (scanning direction) into three in the drawing, without spacing and an overlap area between the templates.

Figure 20E:
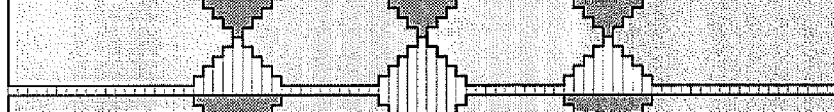
Figure 20F:
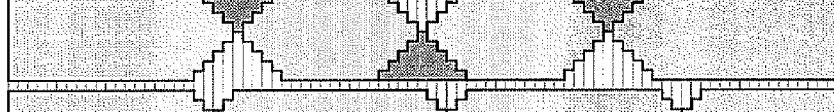
Figure 20G:
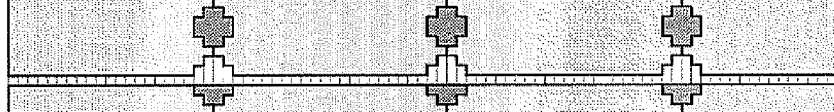
Figure 20H:
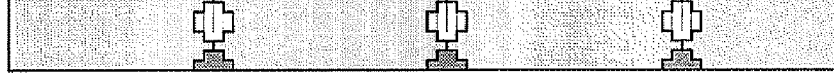

Or, as shown in FIGS. 20E to 20H, the combinations of templates, with which overlap areas and missing areas having the same shape and area size as the overlap areas are generated between adjacent templates, can be employed. Of these combinations, the combinations in FIGS. 20E and 20F are obtained by vertically reversing the orientation of the even number templates from the left-hand side of a plurality (four) of the templates shown in FIGS. 20A and 20B, respectively. And, the combinations of templates in FIGS. 20G and 20H are obtained, respectively, by changing the shape of the stitching sections of adjacent templates in FIG. 20C and combining such templates with which overlap areas and missing areas having the same shape and area size as the overlap areas between the adjacent templates are generated. In either case of FIGS. 20E to 20H, the overlap areas can appropriately compensate for the missing areas and therefore, the extra areas (hereinafter, referred to a real redundant area) does not exist. Accordingly, even when either of the combinations in FIGS. 20A to 20H is employed, the similar results can be obtained in a case where a pattern is formed with a scanning exposure method using variable shaped mask VM similarly to the embodiment described above.

Further, when a pattern image is formed on wafer W by irradiation of a laser light of 50 pulses as in the above-described second embodiment, for example, in a case where a pattern having a linewidth that is not the integral multiple of the projection magnification of the size of the micromirror (the size of pixel on wafer W), a pattern forming method (hereinafter, referred to as digital grayscale exposure) can be employed in which a plurality of basic patterns that are different from each other in a distribution state of the bright area and the dark area are sequentially generated at the variable shaped mask and pattern formation (exposure) is performed by combining theses basic patterns so as to achieve 50 pulses in total. Accordingly, in the exposure apparatus related to the forging second exposure, instead of the processing in step 128 described above, based on the setting information of the templates and the information on the target pattern (superimposed information of a basic patter in accordance with the target pattern, which includes a plurality of basic patterns that are different from each other in a distribution state of the bright area and the dark area and information on the integrated light quantity (the number of pulses) of illumination light IL irradiated on variable shaped mask VM with respect to each of the basic patterns), main controller 20 can perform control of the ON/OFF state of the micromirrors of variable shaped mask VM via drive system 30. In other words, during a period when the target pattern is formed on wafer W, main controller 20 can control a plurality of micromirrors of variable shaped mask VM so that at least either one of the number and the positions of a plurality of micromirrors on variable shaped mask VM, which contribute to the formation of the pattern on wafer W by irradiation of illumination light IL, is changed. With this control, it becomes possible to form the target pattern in each shot area on wafer W with high precision, regardless of the linewidth of the target pattern. Further, with this control, in a case where an area (illumination area) on wafer W that can be exposed at one time with variable shaped mask VM is virtually divided into a plurality of pixels, the size of one pixel can be increased to some extent. In other words, even if the total number of pixels is small, a given pattern can be formed with high precision at a given position on wafer W. Accordingly, it becomes possible to form a desired pattern on wafer W with high precision, without increasing the number of the micromirrors subject to control, which can restrain the cost of variable shaped mask VM from increasing.

Incidentally, in the exposure apparatus of each of the embodiments above, when exposure using the templates described above is performed, the digital grayscale exposure can be employed not only for the non-stitching sections but also the stitching sections. In this case, however, in order to form the pattern with high precision, it is desirable to employ the combination without the missing areas, for example, the combinations of a plurality of templates as in FIGS. 20A to 20D.

Meanwhile, as a result of the simulation performed by the inventors and the like, it has been found recently that under the setting conditions of a plurality of templates without real redundant areas as in the embodiments above and FIGS. 20A to 20H, there are some cases where the linewidth of a pattern formed on wafer W is different from the design value in the scanning exposure described above, depending on the exposure conditions.

More specifically, the inventors and the like have performed the simulation in which various patterns each having a target linewidth of 350 nm (5 pixels assuming the size of one pixel on wafer W is 70 nm) are formed on wafer W on which a positive resist is coated, under normal illumination conditions in which the wavelength of an illumination light is 445 nm, the numerical aperture (N.A.) of a projection optical system is 0.95, and a coherence factor σ value is 0.95, and as a consequence, the results as in the following a. to e. have been obtained.

a. In a case of forming a line-and-space (L/S) pattern made up of vertical lines, the L/S pattern having the linewidth of 350 nm in the non-stitching section (the section other than the stitching section) and the linewidth of 362 nm in the stitching section is formed on wafer W.

b. In a case of forming a line-and-space (L/S) pattern made up of lateral lines, the L/S pattern having the linewidth of 350 nm in the non-stitching section and the linewidth of 372 nm in the stitching section is formed on wafer W.

c. In a case of forming an isolated space pattern made up of a vertical line, the isolated space pattern having the linewidth of 350 nm in the non-stitching section and the linewidth of 325 nm in the stitching section is formed on wafer W.

d. In a case of forming an isolated space pattern made up of a lateral line, the isolated space pattern having the linewidth of 350 nm in the non-stitching section and the linewidth of 340 nm in the stitching section is formed on wafer W.

e. In a case of forming an isolated line pattern, the isolated line pattern having the linewidth of 350 nm in the non-stitching section and the linewidth of 377 nm in the stitching section is formed on wafer W.

These results show that the linewidth difference between the stitching section and non-stitching section, and the linewidth difference between the vertical and lateral lines and the linewidth difference between the isolated and dense lines in the stitching section are generated. Accordingly, exposure on the stitching section needs to be devised. Therefore, when the results of the above a. to e. are analyzed, it can be found that the line gets thicker and the space gets thinner in the stitching section. As one of the causes, the following reason can be given.

That is, in the non-stitching section other than the stitching section, a reflected diffraction light from a specific micromirror located at a position other than the end in the non-scanning direction of variable shaped mask VM mainly contributes to formation (image forming) of a pattern on wafer W, but a part of the diffraction lights from micromirrors that are located adjacent or close to both sides of the specific micromirror in the non-scanning direction also enters projection optical system PL. On the other hand, in the stitching section, a reflected diffraction light from a specific micromirror located at the end in the non-scanning direction of variable shaped mask VM mainly contributes to formation (image forming) of a pattern on wafer W, but there is no micromirror on one side of the specific micromirror in the non-scanning direction, and therefore, the light quantity of the diffraction light entering projection optical system PL is smaller compared with that of the non-stitching section. In other words, the stitching section and non-stitching section are different in influence by optical proximity effect. For such a reason, the insufficient exposure dose (under dose) occurs in the stitching section, compared with the non-stitching section. Accordingly, the exposure dose in the stitching section needs to be increased.

Therefore, in the exposure apparatus in each of the embodiments above, in order to increase the exposure dose in the stitching sections of the templates, a real redundant area (extra area) can be generated between the adjacent templates.

Figure 21A:
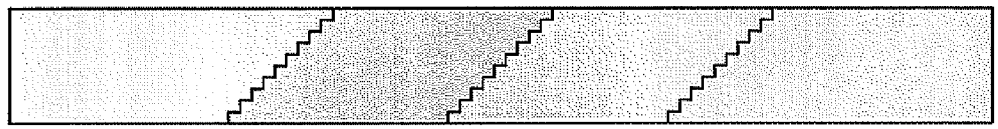
FIGS. 21A and 21B are views used to explain a case of generating real redundant areas (extra areas) between the adjacent templates so as to increase the exposure dose on stitching sections of the templates.
Figure 21B:
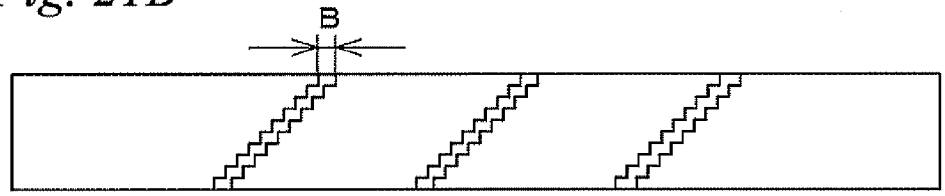

For example, as shown in FIG. 21A, a case where the combination of a plurality of templates similar to the case of FIG. 20B is considered. In this case, main controller 20 can change the positional relation between the plurality of templates in the non-scanning direction so that an overlap area (in this case, a real redundant area) with a width B between the adjacent templates as shown in FIG. 21B is formed, and perform scanning exposure in the similar procedure to the above-described one. With this operation, the insufficient exposure dose (under dose) in the stitching sections can be improved. In such a case, it is desirable that main controller 20 sets each of the plurality of templates in a state where the overlap area having the width B described above (hereinafter, referred to as the overlap width B), i.e. the overlap quantity, which is determined by taking into consideration correction of the linewidth error of patterns included in the target pattern, due to the optical proximity effect, is generated between the templates.

In this case, main controller 20 can perform test exposure prior to actual exposure, and during the test exposure, change the positional relation among the plurality of templates in the non-scanning direction and perform scanning exposure to form a predetermined test pattern on wafer W. During this operation, main controller 20 can repeatedly perform the test exposure to form a test pattern at different positions on wafer W while setting overlap width B to various values. Then, after the test exposure has been completed, main controller 20 carries wafer W on stage ST to, for example, a coater/developer (C/D, not shown) inline connected to exposure apparatus 100 via a carrier system (not shown), and waits until the wafer W is developed by the C/D. When the development has been completed, main controller 20 loads wafer W after the development on stage ST again, and measures the linewidth of resist images of a plurality of test patterns formed on wafer W after the development by using an alignment detection system (not shown). Then, main controller 20 selects a test pattern in which the linewidths of the line patterns in the stitching section and the non-stitching section are closest to each other and stores overlap width B corresponding to the selected test pattern in a memory.

Then, during the actual exposure, a plurality of templates can be set so that the overlap area with overlap width B stored in the memory is formed between the adjacent templates and the stitching exposure can be performed.

Incidentally, it is needless to say that the setting of the templates, with which the overlap area is formed at one position in the non-scanning direction, can be performed with respect to each exposure using each test pattern, when performing the foregoing test exposure.

Figure 21C:
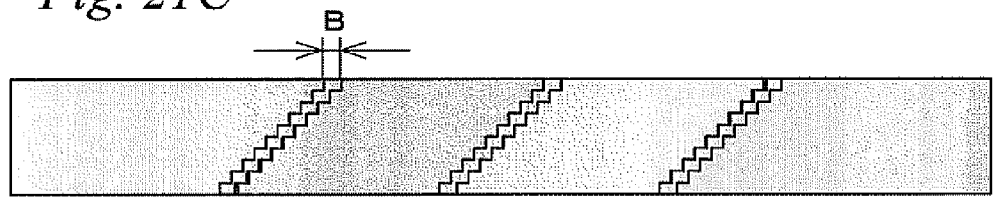
FIGS. 21C and 21D are views respectively showing other examples of combination of the templates to generate the real redundant areas (extra areas) between the adjacent templates.

Incidentally, in the above description, the positional relation of a plurality of templates is changed without changing the shape of the templates, but instead, as shown in FIG. 21C, main controller 20 can perform the setting of templates with which the overlap area with overlap width B is formed between the adjacent templates by extending the respective templates in the non-scanning direction with the inclination of the inclination section being maintained, so as to change the shape of the templates. Or, it is also possible that multiple types of parallelogram or trapezoidal templates having the different sizes in the non-scanning direction are prepared beforehand, and main controller 20 selects and sets the combination of the templates with which overlap width B becomes a desired value, from among the multiple types of the templates.

The setting of the overlap area with overlap width B between the templates can be similarly performed with respect to the combinations of the templates such as those shown in FIGS. 20A, 20C and 20D described above.

Figure 21D:
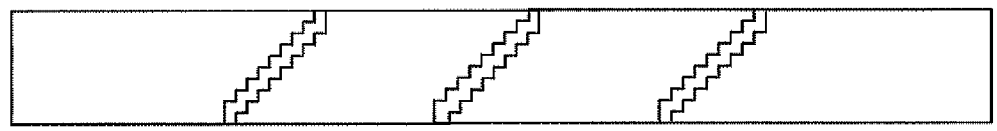

In addition, main controller 20 can perform the setting of a plurality of templates with which the overlap areas as shown in FIG. 21D are formed between the adjacent templates, by extending the respective templates shown in FIG. 21A in the non-scanning direction and also slightly changing the shape of the templates, while maintaining the inclination of the inclination section.

Further, also in a case of using the combinations of the templates as shown in FIGS. 21B to 21D, main controller 20 can employ the digital grayscale exposure method described previously in combination with the setting of the templates. In such a case, it becomes possible to form a target pattern in each shot area on wafer W with high precision, regardless of the linewidth of the target pattern, and also it becomes possible to form a desired pattern on wafer W with high precision without increasing the number of the micromirrors subject to control.

Figure 22:
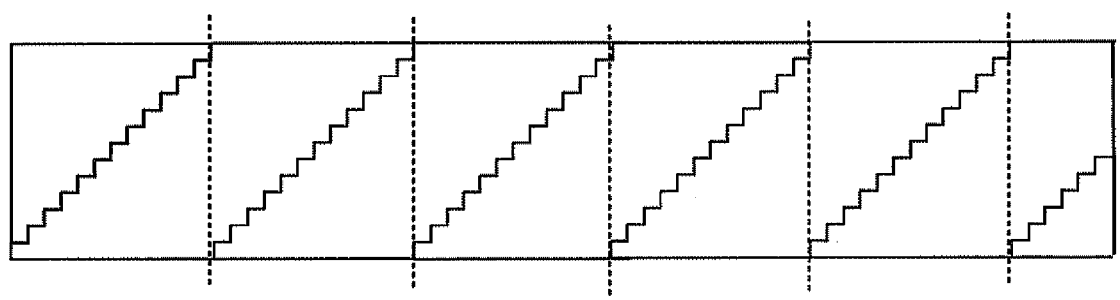
FIG. 22 is a view showing an example of combination of templates each having a shape invariably having the screen stitching at one point in all areas in a non-scanning direction.

Besides, as shown in FIG. 22, the combination of templates, each of which has a shape invariably including a screen stitching at one position, can be employed in the entire area in the non-scanning direction. In such a case, the linewidth difference does not occur between the stitching section and the non-stitching section. Incidentally, the combination of templates is not limited thereto, and the combination of templates, each of which has a shape invariably including the same number of screen stitching at two or more positions, can be employed in the entire area in the non-scanning direction.

Further, in the embodiment above, although a case has been described where the number of laser pulses necessary for forming a pattern in accordance with the design data is 50 pulses, the present invention is not limited thereto. For example, a laser pulse of at least one pulse can be irradiated on variable shaped mask VM with respect to each of the setting positions of the templates. Further, in the embodiments above, a case has been described where the size of pixel is 70 nm×70 nm, but the size is not limited thereto as a matter of course.

Incidentally, the present invention is suitable for a case of forming line-and-space patterns on wafer W as a matter of course, and also suitable for a case of forming not only dot patterns and other dense patterns but also isolated patterns.

Incidentally, in each of the embodiments above, the illumination optical system is equipped with a field stop, but for example, the irradiation area of the illumination light on wafer W can substantially be defined by the ON state/OFF state of the respective micromirrors of the variable shaped mask.

Further, in each of the embodiments above, a case has been described where a harmonic wave generating device that generates a harmonic wave of a single wavelength laser light that is oscillated by a single wavelength oscillation laser is used as the light source, but this is not intended to be limiting, and if a variable shaped mask is illuminated with an illumination light having a wavelength around 400 nm, a harmonic wave generating device of YAG laser can be used. In addition, in a case where the repetition frequency of laser oscillation is not so required, an ArF excimer laser or the like can be used.

Further, in each of the embodiments above, a case has been described where the illumination light is a pulsed light, but the present invention is not limited thereto, and a continuous light can be used as the illumination light. In such a case, as the superimposed information in accordance with the target pattern described earlier, information including a plurality of basic patterns that are different from each other in a distribution state of a bright area and a dark area and an irradiation time of the illumination light irradiated on the variable shaped mask with respect to each of the basic patterns (information on the integrated light quantity) can be used.

Incidentally, in each of the embodiments above, although a case has been described where the variable shaped mask that includes the micromirror array serving as a non-emission type image display device is used, a non-emission type image display device as described below can be used instead of the micromirror array. In this case, the non-emission type image display device is also called a spatial light modulator (SLM) and is a device that spatially modulates amplitude (intensity), phase or polarization states of the light that propagates in a predetermined direction, and as a transmissive spatial light modulator, an electrochromic display (ECD) or the like can be given as an example, besides a transmissive liquid crystal display device (LCD: Liquid Crystal Display). Furthermore, as a reflective spatial light modulator, besides the micromirror array described above, a reflective liquid crystal display device, an electrophoretic display (EPD), an electron paper (or an electron ink), an optical diffraction light valve (Grating Light Valve), or the like can be given as an example.

Incidentally, in a case where a variable shaped mask is configured using a non-emission type image display device of a reflective type, a catadioptric system or a catoptric system can be used as a projection optical system, besides the dioptric system described previously. Further, a variable shaped mask including a non-emission type image display device of a transmissive type can be used in combination with the catadioptric system, the catoptric system or the dioptric system serving as the projection optical system. Further, the optical system equipped in the exposure apparatus of the present invention is not limited to a reduction system, but can be an equal magnifying system or a magnifying system.

Figure 23:
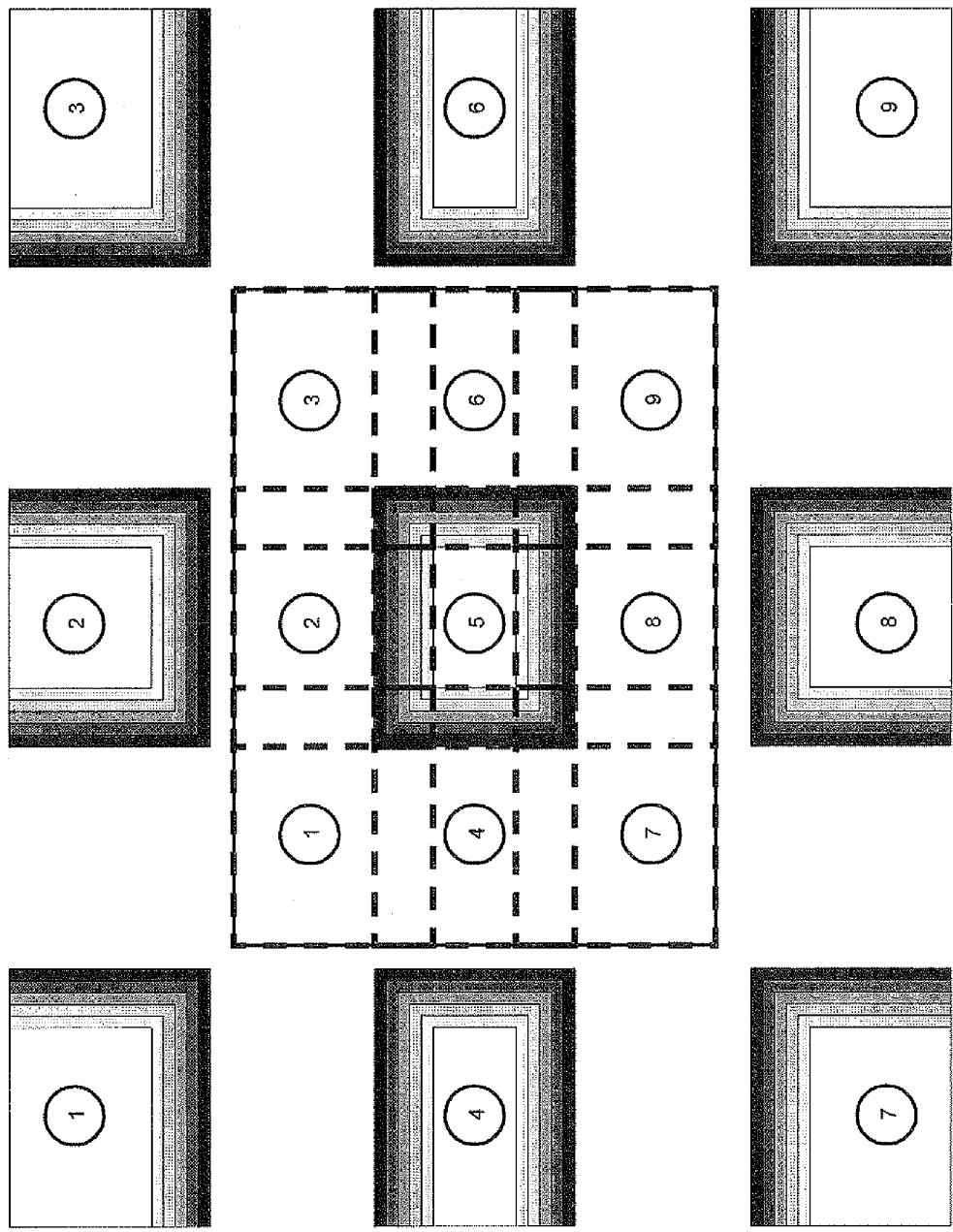
FIG. 23 is a view showing an example of combination of divided patterns used in overlay exposure of the 9 (=3×3) divided areas, which are used in a static type exposure apparatus.

Incidentally, in the embodiments above, while the exposure apparatus that performs scanning exposure is described, the pattern forming method related to some of the claims below can be applied to, for example, an exposure apparatus of a static exposure type (one-shot exposure type). FIG. 23 shows an example of a combination of divided patterns used in overlay exposure of 3×3=9 divided areas, which is used in a static type exposure apparatus. The difference in grayscale of the respective divided patterns shows the difference in exposure dose. The overlay exposure using the combination of the divided patterns as shown in FIG. 23 is performed as follows.

More specifically, when a target pattern is formed on a shot area on wafer W by stitching light patterns generated by variable shaped mask VM, a setting process is repeatedly performed a plurality of times, in which a plurality of templates (rectangular templates in this case) that define a use area of variable shaped mask VM are respectively set in a two-dimensional pixel area where the target pattern is formed in a state where the overlap areas between the templates are partly generated, while changing the sizes of the plurality of templates so that the width of the overlap areas between the templates is changed at a plurality of steps. Then, every time when the setting process is performed, a process, in which a plurality of micromirror mechanisms $M_{ij}$ of variable shaped mask VM are sequentially controlled based on information on setting of the respective templates and information on the target pattern, is performed.

Incidentally, in each of the embodiments above, a case has been described where pattern generating device 12 includes variable shaped mask VM having a plurality of micromirrors, but this is not intended to be limiting, and another pattern generating device 12 (e.g. a pattern generating device equipped with multiple optical fibers, or the like) can be employed.

Incidentally, the values such as the sizes shown in each of the embodiments above are merely examples, and the values are not limited to those described in each of the embodiments above.

Incidentally, in each of the embodiments above, although a case has been described where only one wafer stage WST is provided, this is not intended to be limiting, and a twin-stage type stage device equipped with two wafer stages can also be employed, or a stage device equipped with a wafer stage and a measurement stage as is disclosed in, for example, International Publication No. 2005/074014 (the corresponding U.S. Patent Application Publication No. 2007/0127006) and the like can also be employed.

Incidentally, the present invention can also be applied to a liquid immersion exposure apparatus that is disclosed in, for example, International Publication No. 2004/053955 (the corresponding U.S. Patent Application Publication No. 2005/0259234) and the like.

Incidentally, an object on which a pattern is to be formed (an object subject to exposure to which an energy beam is irradiated) in each of the embodiments above is not limited to a wafer, but can be another object such as a glass plate, a ceramic substrate or a mask blank.

Further, the exposure apparatus of the embodiments above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Incidentally, the above disclosures of the various publications, the International Publications descriptions, and the U.S. Patent Application Publications descriptions, and the U.S. patents descriptions that are cited in the description above and related to exposure apparatuses and the like are each incorporated herein by reference.

Device Manufacturing Method

Figure 24:
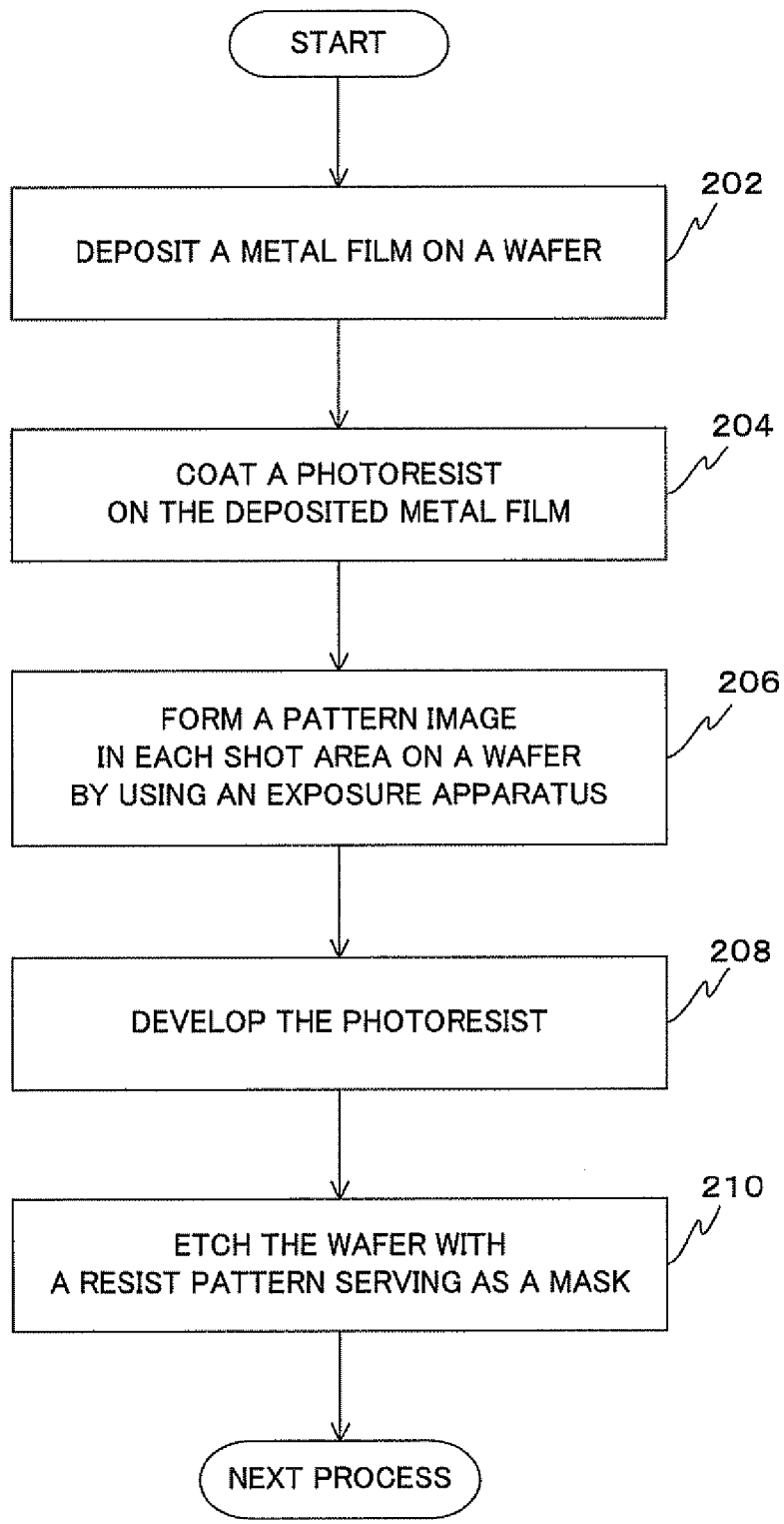
FIG. 24 is a flowchart used to explain a manufacturing method of a semiconductor device as a microdevice.

Next, a manufacturing method of a microdevice, in which the exposure apparatus related to each of the embodiments above is used in a lithography process, is described. FIG. 24 shows a flowchart used to explain the manufacturing method a semiconductor device as the microdevice.

First of all, in step 202, a metal film is deposited on wafers (plates) in one lot. In the next step, step 204, a photoresist is coated on the metal film on the wafers (plates) in the one lot. After that, in step 206, the exposure apparatus related to each of the embodiments above sequentially projects an image of a pattern, which has been generated at a variable shaped mask, on each of shot areas on the wafers (plates) in the one lot, via projection optical system PL, in accordance with information on a target pattern determined based on design data (including the superimposed information of the basic pattern described earlier regarding the target pattern whose size is not equal to the integral multiple of the size of the two-dimensional pixel that is virtually set on the plate so as to correspond to the arrangement of a plurality of the modulation elements) (and information on setting of the templates).

Then, after development of the photoresist on the wafers (plates) has been performed in the one lot in step 208, etching is performed by using the resist pattern serving as a mask, on the wafers (plates) in the one lot in step 210, thereby forming a circuit pattern corresponding to the design data in each of the shot areas on the respective wafers (plates).

After that, by performing formation of the circuit pattern of the upper layers and the like, a device such as a semiconductor device is manufactured. Accordingly, a pattern with a desired linewidth can be formed at a desired position with high accuracy, which makes it possible, as a consequence, to manufacture the device such as the semiconductor device with good yield.

Figure 25:
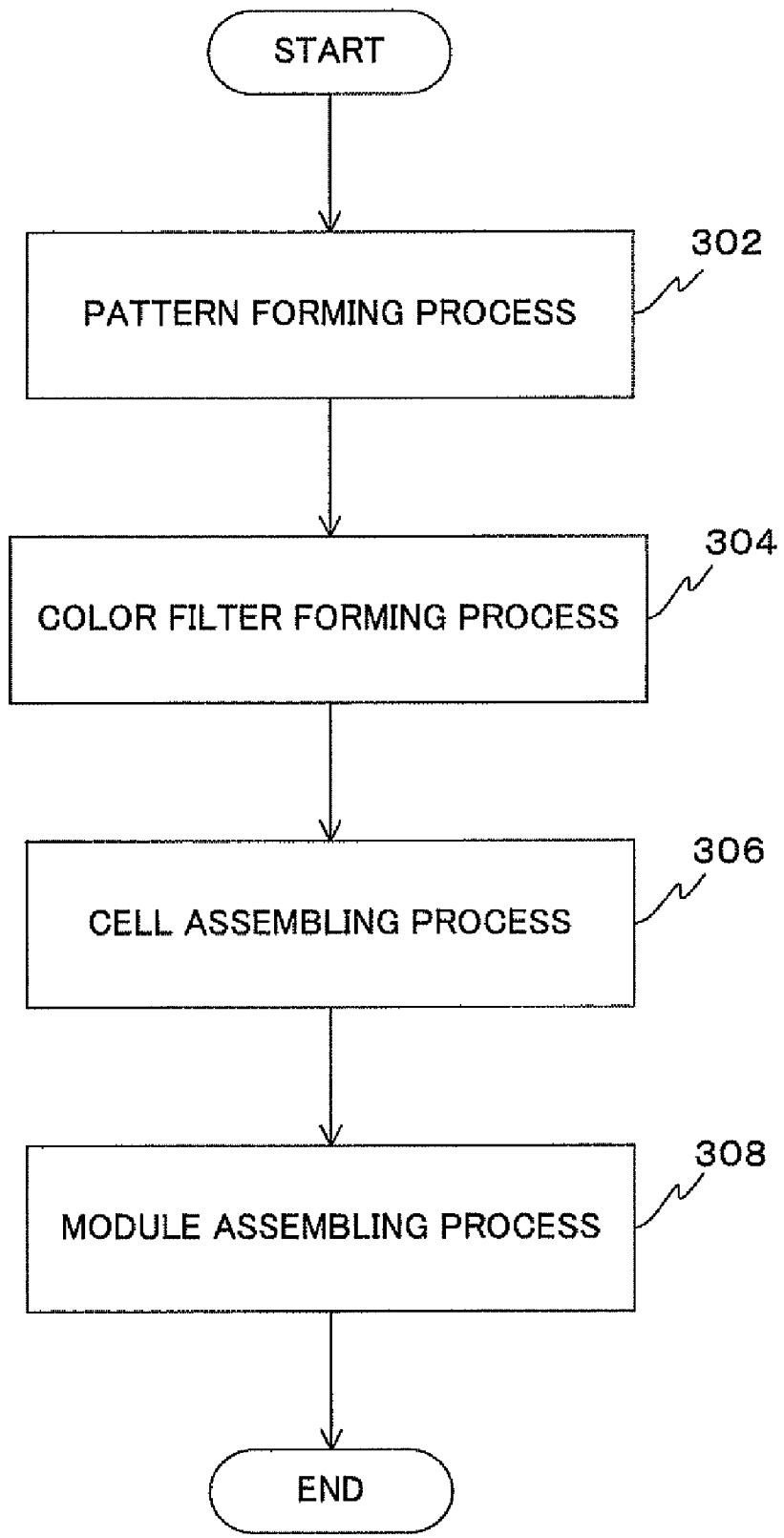
FIG. 25 is a flowchart used to explain a method of manufacturing a liquid crystal display device as a microdevice.

Further, in the exposure apparatus related to each of the embodiments above, a liquid crystal display device as a microdevice can be obtained by forming a predetermined pattern (such as a circuit pattern or an electrode pattern) on a plate (a glass substrate). FIG. 25 shows a flowchart used to explain a method of manufacturing a liquid crystal display device as a microdevice, by forming a predetermined pattern on a plate using the exposure apparatus of each of the embodiments above.

In a pattern forming process in step 302, the exposure apparatus related to each of the embodiments above executes a so-called optical lithography process, in which an image of a pattern generated at a variable shaped mask is sequentially formed on a photosensitive substrate (such as a glass substrate coated with a resist) via projection optical system PL in accordance with information on a target pattern determined based on design data (including the superimposed information of the basic pattern described earlier regarding the target pattern whose size is not equal to the integral multiple of the size of the two-dimensional pixel that is virtually set on the plate so as to correspond to the arrangement of a plurality of the modulation elements) (and information on setting of the templates). By the optical lithography process, a predetermined pattern including many electrodes and the like is formed on the photosensitive substrate. After that, the exposed substrate undergoes the processes such as a development process, an etching process and a resist removing process, and thus the predetermined pattern is formed on the substrate.

Next, a color filter forming process in step 304, a color filter in which many sets of three dots corresponding to R (Red), G (Green) and B (blue) are disposed in a matrix shape, or a color filter in which a plurality of sets of three stripes of R, G and B are disposed in horizontal scanning line directions is formed. Then, after the color filter forming process (step 304), a cell assembling process in step 306 is executed. In the cell assembling process in step 306, a liquid crystal panel (liquid crystal cell) is assembled using the substrate having the predetermined pattern obtained in the pattern forming process, the color filter obtained in the color filter forming process, and the like.

In the cell assembling process in step 306, for example, the liquid crystal panel (liquid crystal cell) is manufactured by injecting liquid crystal between the substrate having the predetermined pattern obtained in the pattern forming process and the color filter obtained in the color filter forming process. After that, in a module assembling process in step 308, a liquid crystal display device is completed by attaching an electric circuit that makes a display operation of the assembled liquid crystal panel (liquid crystal cell) perform, and respective components such as a backlight. Accordingly, in the pattern forming process with this manufacturing method of microdevices, a pattern image with a desired linewidth can be formed at a desired position with high accuracy, and as a consequence, the liquid crystal display device can be manufactured with good yield.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure method of exposing an object with an energy beam via a pattern forming apparatus, the method comprising:

a detection process in which, during a period after starting exposure to a plurality of pattern formation areas subject to exposure on the object until exposing all the pattern formation areas subject to exposure, information on a positional relation between the energy beam and the object is detected by receiving the energy beam via the pattern forming apparatus, using a measurement pattern arranged on a movable body that holds the object, wherein the measurement pattern is a slit-shaped opening.

2. The exposure method according to claim 1, further comprising:

a calibration process in which at least one of movement control information of the movable body, the information on the positional relation between the energy beam and the object and measurement information of a measurement system that measures a position of the movable body is calibrated by using the detection result.

3. The exposure method according to claim 2, wherein both the detection process and the calibration process are performed during a period after starting exposure to the plurality of pattern formation areas subject to exposure on the object until exposing all the pattern formation areas subject to exposure.

4. The exposure method according to claim 1, wherein the measurement pattern is arranged at a plurality of positions on the movable body.

5. The exposure method according to claim 1, further comprising:
a signal acquiring process in which an energy beam having passed through the slit-shaped opening is photoelectrically converted and a photoelectric conversion signal in accordance with the energy beam having passed through the slit-shaped opening is acquired.

6. The exposure method according to claim 1, wherein the pattern forming apparatus includes an optical device having a mirror element on which a reflection surface is formed.

7. A device manufacturing method, including:
a lithography process in which the exposure method according to claim 1 is used.

8. A device that is manufactured with the device manufacturing method according to claim 7.

9. An exposure method of exposing an object with an energy beam via a pattern forming apparatus, the method comprising:
a photodetection process in which, during a period after starting exposure to a plurality of pattern formation areas subject to exposure on the object until exposing all the pattern formation areas subject to exposure, the energy beam via the pattern forming apparatus is received using a measurement pattern arranged on a movable body that holds the object,
wherein the measurement pattern is a slit-shaped opening.

10. The exposure method according to claim 9, wherein the photodetection process is performed during a period after performing exposure that accompanies an operation of moving the movable body from one side to the other side in one axial direction before performing exposure that accompanies an operation of moving the movable body from the other side to the one side in the one axial direction.

11. The exposure method according to claim 10, wherein the measurement pattern is placed in a vicinity of a section of the movable body, the section holding the object.

12. The exposure method according to claim 11, wherein the plurality of pattern formation areas are formed along a predetermined array, and
the photodetection process is executed every time when performing exposure to the pattern formation areas that are included in a predetermined number of columns in the predetermined array.

13. The exposure method according to claim 12, wherein the photodetection process is executed every time when performing exposure to the pattern formation areas in one column in the predetermined array.

14. The exposure method according to claim 9, further comprising:
a detection process in which information on a positional relation between the energy beam and the object is detected by using the photodetection result.

15. The exposure method according to claim 14, further comprising:
a calibration process in which at least one of movement control information of the movable body, the information on the positional relation between the energy beam and the object and measurement information of a measurement system that measures a position of the movable body is calibrated by using the detection result.

16. The exposure method according to claim 15, wherein both the detection process and the calibration process are performed during a period after starting exposure to the plurality of pattern formation areas subject to exposure on the object until exposing all the pattern formation areas subject to exposure.

17. The exposure method according to claim 9, wherein the measurement pattern is arranged at a plurality of positions on the movable body.

18. The exposure method according to claim 9 further comprising:
a signal acquiring process in which an energy beam having passed through the slit-shaped opening is photoelectrically converted and a photoelectric conversion signal in accordance with the energy beam having passed through the slit-shaped opening is acquired.

19. The exposure method according to claim 9, wherein the pattern forming apparatus includes an optical device having a mirror element on which a reflection surface is formed.

20. A device manufacturing method, including:
a lithography process in which the exposure method according to claim 9 is used.

21. A device that is manufactured with the device manufacturing method according to claim 20.

22. An exposure apparatus to expose an object with an energy beam via a pattern forming apparatus, the exposure apparatus comprising:
a movable body that moves while holding the object, wherein
a measurement pattern is arranged in a section of the movable body excluding a holding section that holds the object, the section being a section through which the energy beam passes during a period after starting exposure to a plurality of pattern formation areas subject to exposure on the object until exposing all the pattern formation areas subject to exposure.

23. The exposure apparatus according to claim 22, further comprising:
a calibration device that calibrates at least one of movement control information of the movable body, information on a positional relation between the energy beam and the object and measurement information of a measurement system that measures a position of the movable body.

24. The exposure apparatus according to claim 22, wherein the measurement pattern is a slit-shaped opening, and the exposure apparatus further comprises:
a detector that detects an energy beam having passed through the slit-shaped opening, of the energy beam via the pattern forming apparatus.

25. The exposure apparatus according to claim 24, further comprising:
a controller that controls movement of the movable body so that the slit-shaped opening and the energy beam relatively move.

26. The exposure apparatus according to claim 24, wherein the detector photoelectrically converts the energy beam having passed through the slit-shaped opening and acquires a photoelectric conversion signal in accordance with the energy beam having passed through the slit-shaped opening.

27. The exposure apparatus according to claim 22, wherein the measurement pattern is a reflective pattern, and the exposure apparatus further comprises:
a detector that detects a light reflected off the reflective pattern.

28. The exposure apparatus according to claim 22, wherein the pattern forming apparatus includes an optical device having a mirror element on which a reflection surface is formed.

\* \* \* \* \*

UNITED STATES PATENT AND TRADEMARK OFFICE
CERTIFICATE OF CORRECTION

PATENT NO. : 8,089,616 B2  Page 1 of 1
APPLICATION NO. : 12/648648
DATED : January 3, 2012
INVENTOR(S) : Soichi Owa It is certified that error appears in the above-identified patent and that said Letters Patent is hereby corrected as shown below:

Title Page, add

(56)      References Cited

U.S. PATENT DOCUMENTS 5,523,193 A * 06/1996

Signed and Sealed this
First Day of May, 2012

David J. Kappos
*Director of the United States Patent and Trademark Office*